United States Patent
Kiritani

(10) Patent No.: US 6,815,299 B2
(45) Date of Patent: Nov. 9, 2004

(54) METHOD FOR MANUFACTURING SILICON CARBIDE DEVICE USING WATER RICH ANNEAL

(75) Inventor: Norihiko Kiritani, Kanagawa-ken (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/817,154

(22) Filed: Mar. 27, 2001

(65) Prior Publication Data

US 2002/0052102 A1 May 2, 2002

(30) Foreign Application Priority Data

Aug. 31, 2000 (JP) ..................................... P2000-263069

(51) Int. Cl.[7] .......................................... H01L 21/336
(52) U.S. Cl. .................... 438/305; 438/585; 438/706
(58) Field of Search ................................ 438/305, 585, 438/706, 763, 765, 767, 770, 773, 787, 931; 257/77

(56) References Cited

U.S. PATENT DOCUMENTS

| | | | | |
|---|---|---|---|---|
| 5,459,107 A | * | 10/1995 | Palmour | 438/763 |
| 5,597,744 A | * | 1/1997 | Kamiyama et al. | 438/285 |
| 5,656,516 A | * | 8/1997 | Suzuki | 438/773 |
| 6,265,326 B1 | * | 7/2001 | Ueno | 438/767 |
| 6,297,172 B1 | * | 10/2001 | Kashiwagi | 438/773 |

FOREIGN PATENT DOCUMENTS

| | | |
|---|---|---|
| JP | 62-81764 | 4/1987 |
| JP | 1-289185 | 11/1989 |
| JP | 3-55843 | 3/1991 |
| JP | 10-112480 | 4/1998 |
| JP | 11-74263 | 3/1999 |
| JP | 11-145131 | 5/1999 |
| JP | 11-219950 | 8/1999 |

OTHER PUBLICATIONS

Ritu Tyagi, et al., "An Isoplanar Isolation Technology for SiC Devices Using Local Oxidation" J. Electrochem. Soc., vol. 141, No. 8, Aug. 1994.

N. Kiritani, et al., Nissan Motor CO., LTD. Nissan Research Center, Electronics and Information Systems Research Laboratory, "Thermal oxide growth on 4H–SiC using $H_2O$ direct oxidation" The Japan Society of Applied Physics and Related Societies, The 47th Spring Meeting. Extended Abstracts. Mar. 28, 2000 (English Abstract).

* cited by examiner

Primary Examiner—George Fourson
Assistant Examiner—Fernando L. Toledo
(74) Attorney, Agent, or Firm—McDermott Will & Emery LLP

(57) ABSTRACT

A method for manufacturing a SiC device embraces (a) depositing a polysilicon film above a SiC substrate; (b) delineating the polysilicon film into required pattern; and (c) annealing the SiC substrate in a water rich ambient to selectively grow a thick localized thermal oxide film above the SiC substrate. At the surface of SiC substrate, source/drain regions and substrate contact region are formed. In the water rich ambient, the $H_2O$ partial pressure is so maintained that it is more than 0.95.

12 Claims, 15 Drawing Sheets

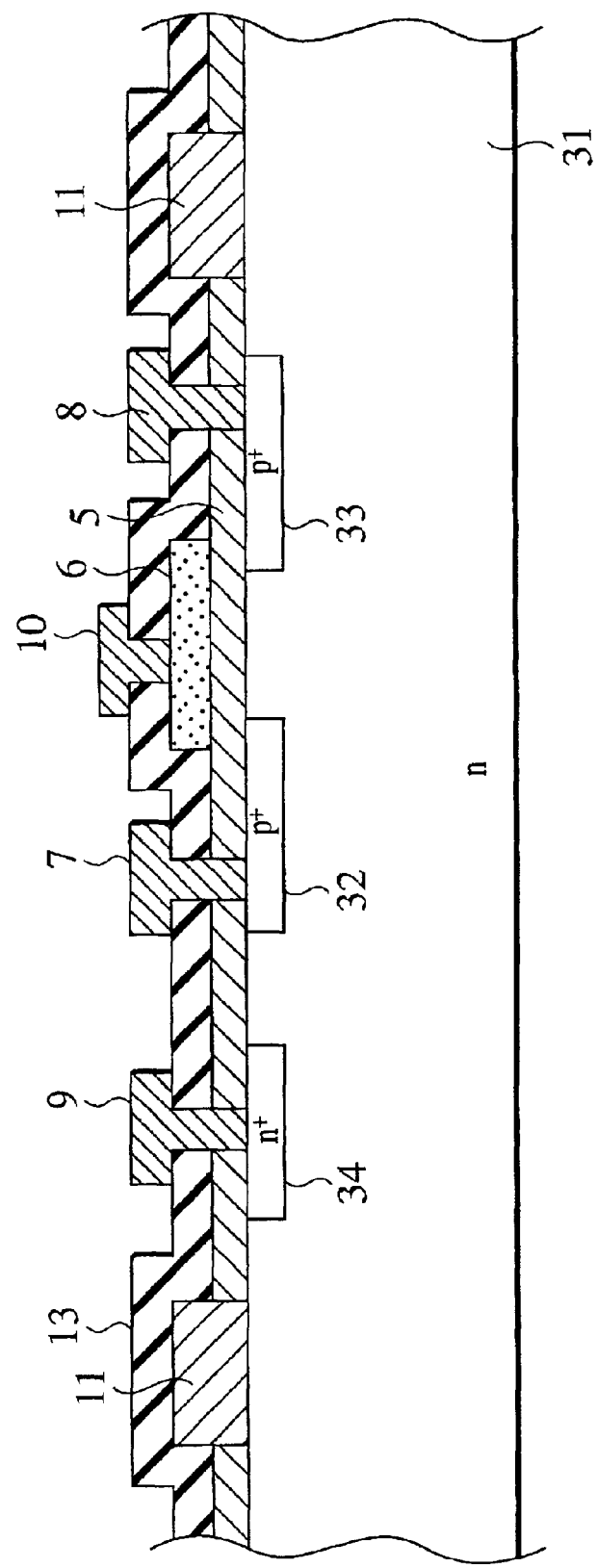

METHOD FOR MANUFACTURING SILICON CARBIDE DEVICE USING WATER RICH ANNEAL

BACKGROUND OF THE INVENTION

1. Field of the Invention

The present invention pertains to a method for manufacturing a silicon carbide (SiC) semiconductor device (hereinafter referred as "the SiC device") in which a silicon oxide ($SiO_2$) film is formed on a SiC substrate and an oxidation furnace suitable for the method.

2. Description of the Related Art

It is known that SiC crystal has thermally and chemically stable crystallographic and electric performances. And the SiC crystal has electric break down characteristic better than that of Si. Among SiC crystals, 4H—SiC, whose band gap is, specifically, approximately three times larger than that of silicon (Si) is a strong candidate for a power device, because it can manifest a very high breakdown characteristics. And the applications of the power SiC device, which can operate with a higher voltage and higher power, to power electronics fields, such as the control system and the like are expected. In the SiC substrate, the bond energy between Si and C in the SiC single crystal has about 1.34 times larger compared to the bond energy between Si and Si in the Si single crystal.

SUMMARY OF THE INVENTION

Manufacturing the SiC device embracing these superior device behaviors by forming a thermal oxide film on the surface of the SiC substrate has been attempted, but the fabrication technology of the SiC device encompassing desired performances in a short manufacturing period has not yet been established.

An object of the present invention is to provide a method for manufacturing the SiC device having a desired performance by forming a silicon oxide film on the surface of the SiC substrate in a short manufacturing period.

Another object of the present invention is to provide a method for manufacturing the SiC device having an improved gate oxide film embracing smaller interface state densities.

Still another object of the present invention is to provide an oxidation furnace suitable for a method for manufacturing the SiC device, especially forming a silicon oxide film on the surface of the SiC substrate in a short manufacturing period.

First feature of present invention inheres in a method for manufacturing a SiC device, embracing (a) depositing a silicon film above a SiC substrate; (b) delineating the silicon film into required pattern; and (c) annealing the SiC substrate in a water rich ambient to selectively grow a localized thermal oxide film above the SiC substrate.

Second feature of present invention inheres in a method for manufacturing a SiC device, encompassing (a) forming a gate oxide film on a surface of a SiC substrate; and (b) annealing the gate oxide film in a water rich ambient at substrate temperature equal to or lower than the substrate temperature at which the gate oxide film is formed.

Third feature of present invention lies in an oxidation furnace encompassing (a) a reaction tube; (b) a boat configured to mount a SiC substrate; (c) a heater configured to heat the SiC substrate; (d) oxygen gas introduction tube connected to an upstream side of the reaction tube; (e) a mass flow controller connected to the oxygen gas introduction tube configured to control a flow rate of oxygen gas; (f) a water introduction tube connected to the upstream side of the reaction tube; and (g) a conveying pump configured to introduce an ultra pure water into the reaction tube through the water introduction tube.

Fourth feature of present invention lies in an oxidation furnace encompassing (a) a reaction space defining means for causing thermal oxidation phenomena therein; (b) a mounting means for mounting a SiC substrate; (c) a heating means for heating the SiC substrate; (d) oxygen gas introduction means for introducing an oxygen gas into the reaction space defining means; and (e) a water introduction means for introducing an ultra pure water into the reaction space defining means such that $H_2O$ partial pressure in the reaction space defining means is controlled to any values between 0 to 1.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

BRIEF DESCRIPTION OF THE DRAWINGS

FIG. 5 is a cross sectional view illustrating another SiC-MOS transistor according to a modification of the first embodiment of the present invention;

DETAILED DESCRIPTION OF THE PREFERRED EMBODIMENTS

Figure 1:
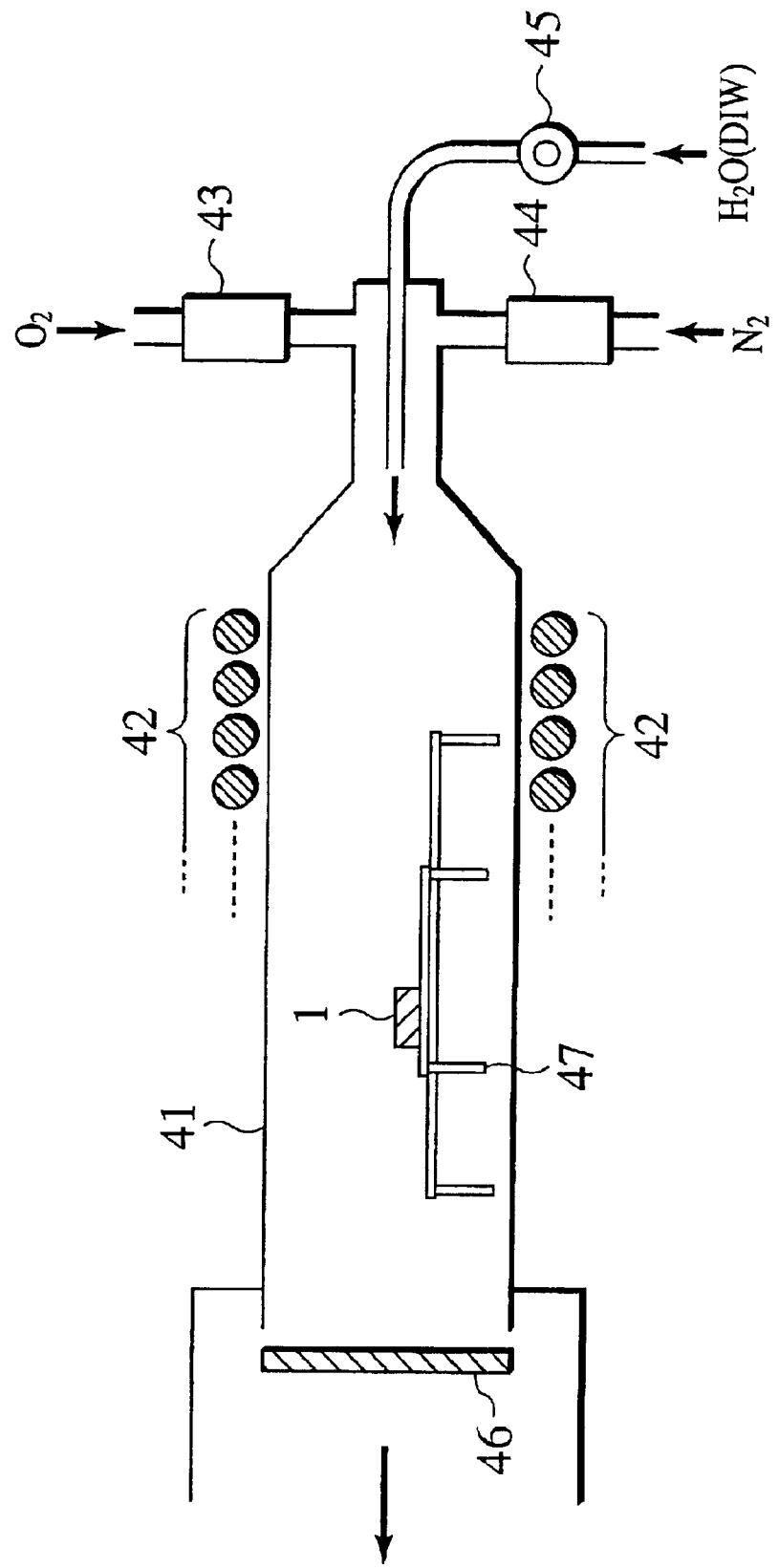
FIG. 1 is a schematic diagram of a $H_2O$ direct oxidation furnace.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set fourth in detail in order not unnecessary obscure the present invention. It being understood the indicator "+" in the Figures indicates relatively strong doping and the indicator "−" in the Figures indicates relatively weak doping. As it will be appreciated, in the following description, the terms drain and source can be exchanged without modifying the structure it self.

(Selective Thermal Oxidation of Silicon)

FIG. 1 is a schematic diagram of $H_2O$ direct oxidation furnace designed for the selective thermal oxidation of silicon. Here, "the silicon" may include single crystalline silicon, polysilicon and amorphous silicon.

As shown in FIG. 1, the $H_2O$ direct oxidation furnace has a reaction space defining means 41 for causing thermal oxidation phenomena therein; a mounting means 47 for mounting a SiC substrate 1; a heating means 42 for heating the SiC substrates; oxygen gas introduction means 43 for introducing an oxygen gas into the reaction space defining means 41; and a water introduction means 45 for introducing an ultra pure water into the reaction space defining means 41 such that $H_2O$ partial pressure in the reaction space defining means 41 is controlled to any values between 0 to 1.

Namely, the p-type 4H—SiC substrate 1 to be undertaken the thermal oxidation is mounted on a quarts boat 47 serving as the mounting means, provided within a quartz reaction tube 41. The quartz reaction tube 41 serves as the reaction space defining means. Instead of the quartz reaction tube 41, a sapphire reaction tube or a SiC reaction tube can serves as the reaction space defining means. A resistive heater 42 serving as the heating means heats the inside of the quartz reaction tube 41. As the heating means an infrared (IR) lamp or a RF induction coil can be employed. If the RF induction coil is used as the heating means, it is preferable to employ a SiC-coated carbon boat as the mounting means, instead of the quarts boat 47.

An oxygen gas introduction tube is connected to an upstream side of the quartz reaction tube 41 (right side in FIG. 1). A mass flow controller (MFC) 43 is connected to the oxygen gas introduction tube. The oxygen gas introduction tube and the MFC 43 serving as the oxygen gas introduction means of the present invention. Then, from the upstream side of the quartz reaction tube 41, oxygen ($O_2$) gas is introduced via the MFC 43 into the quartz reaction tube 41. Nitrogen ($N_2$) gas is introduced via a flow controller 44 into the quartz reaction tube 41.

A water introduction tube is also connected to the upstream side of the quartz reaction tube 41. And a conveying pump 45 is connected to the water introduction tube. The water introduction tube and the conveying pump 45 serves as the water introduction means. Then, into the quartz reaction tube 41, ultra pure water ($H_2O$) is introduced via the conveying pump 45. The ultra pure water has resistivity of 18 M ohms at 25° C., for example. The ultra pure water can be obtained by the distillation or the ion exchange method. In such a $H_2O$ direct oxidation furnace, the $H_2O$ partial pressure in the oxidizing ambient within the quartz reaction tube 41 heated by the resistive heater 42 can be optionally changed from $H_2O$ rich regime to $O_2$ rich regime or to $N_2$ rich regime. Namely the $H_2O$ partial pressure can have any values between 0% to 100% (or between 0 to 1). At the downstream side (left side in FIG. 1), a cap is attached to the quartz reaction tube 41. The heated mixed gas is exhausted to the downstream side via gap between the cap 46 and the quartz reaction tube 41. Even if it is an open type reaction tube such as the thermal diffusion furnace, configured that one end portion of the quartz reaction tube 41 is opened to the atmosphere, a high $H_2O$ partial pressure ambient, or the water rich ambient can be obtained by maintaining the flow rate of the ultra pure water over a specific value, using the conveying pump 45. The cap 46 serves as a baffle to increase the $H_2O$ partial pressure.

Figure 2:
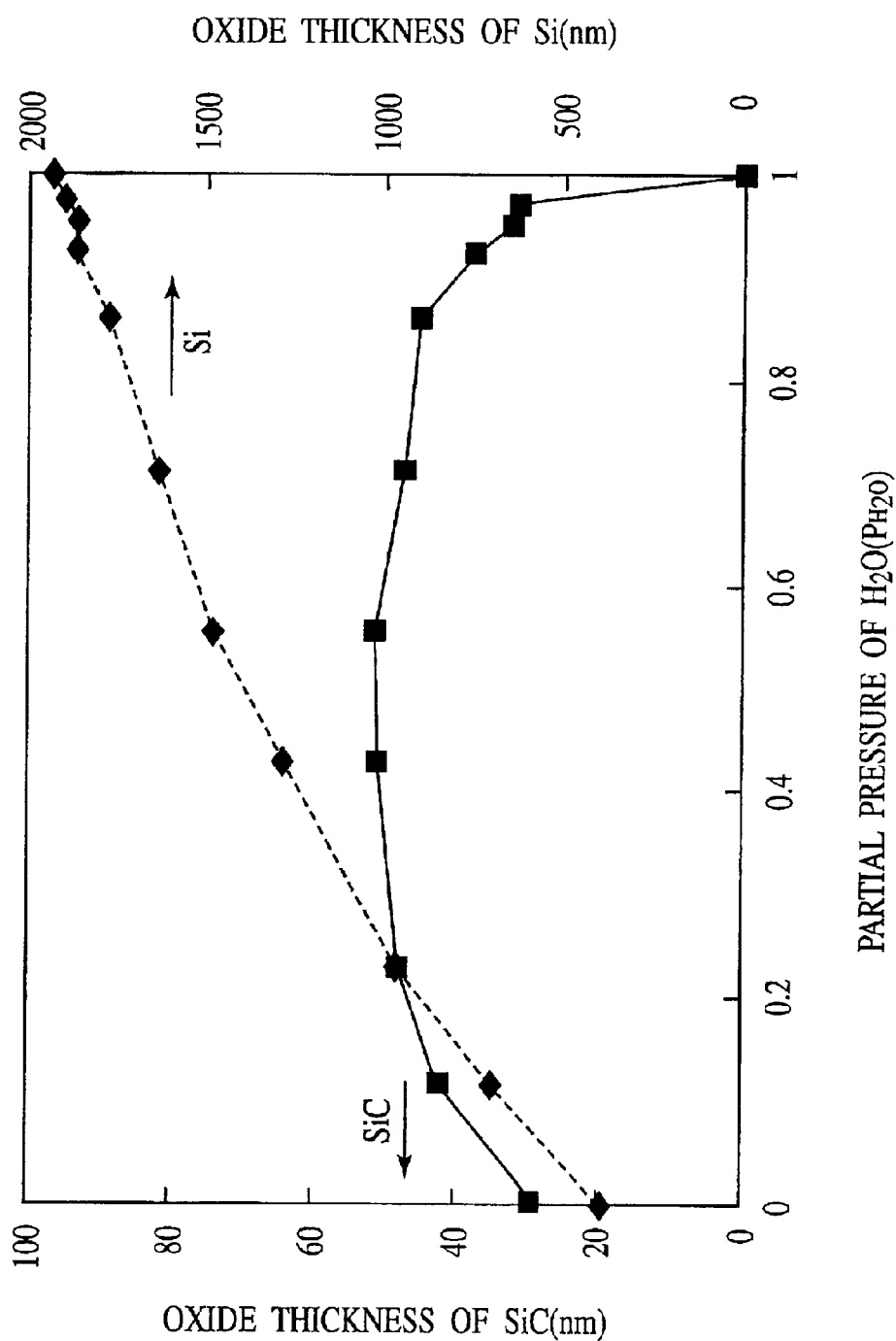
FIG. 2 is a diagram showing an example of relationship between a $H_2O$ partial pressure and a thickness of the silicon oxide film.

FIG. 2 is a diagram representing the relationship between $H_2O$ partial pressure and the thickness of the silicon oxide film, in the case that the thermal oxide film is grown in the $H_2O$ direct oxidation furnace at the substrate temperature of 1100° C. for 7 hours. In FIG. 2, the abscissa denotes $H_2O$ partial pressure in the oxidizing ambient, and the ordinate denotes the thickness of the grown oxide film. The broken line denotes the film thickness formed on the surface of silicon (Si) substrate, the solid line denotes the film thickness formed on the surface of SiC substrate. In FIG. 2, the film thickness formed on the Si substrate increases as the $H_2O$ partial pressure increases to the $H_2O$ rich regime, and when the $H_2O$ partial pressure becomes 1, it takes the maximum value. On the other hand, the film thickness formed on the SiC substrate maintains a certain constant value when $H_2O$ partial pressure lies between 0.2 and 0.9, and when $H_2O$ partial pressure increases to values more than 0.95, it decreased significantly, and the silicon oxide film formation is significantly suppressed under the condition of the $H_2O$ partial pressure being 1. In FIG. 2, in the range where the $H_2O$ partial pressure is less than 1, the $O_2$ partial pressure increases by the amount corresponding to the decreased portion of the $H_2O$ partial pressure. Specifically, the oxidation rate for the SiC substrate is promoted in the $O_2$ rich regime, where the $O_2$ partial pressure dominates in the oxidizing ambient, and the oxidation rate for the SiC substrate is suppressed in the case where the $O_2$ is not included in the $H_2O$ rich regime, or the partial pressure of the $O_2$ in the oxidizing ambient is extremely small compared with the $H_2O$ partial pressure. Moreover, since the oxidation rate for the Si substrate is dozen times of the oxidation rate for the SiC substrate even when the $H_2O$ partial pressure lies below 0.95, the silicon oxide film on the Si substrate can be formed in a shorter growth period compared to the silicon oxide film directly grown on the surface of the SiC substrate.

By utilizing the $H_2O$ direct oxidation furnace shown in FIG. 1 and oxidation characteristics, various semiconductor devices can be manufactured.

(First Embodiment)

Figure 3:
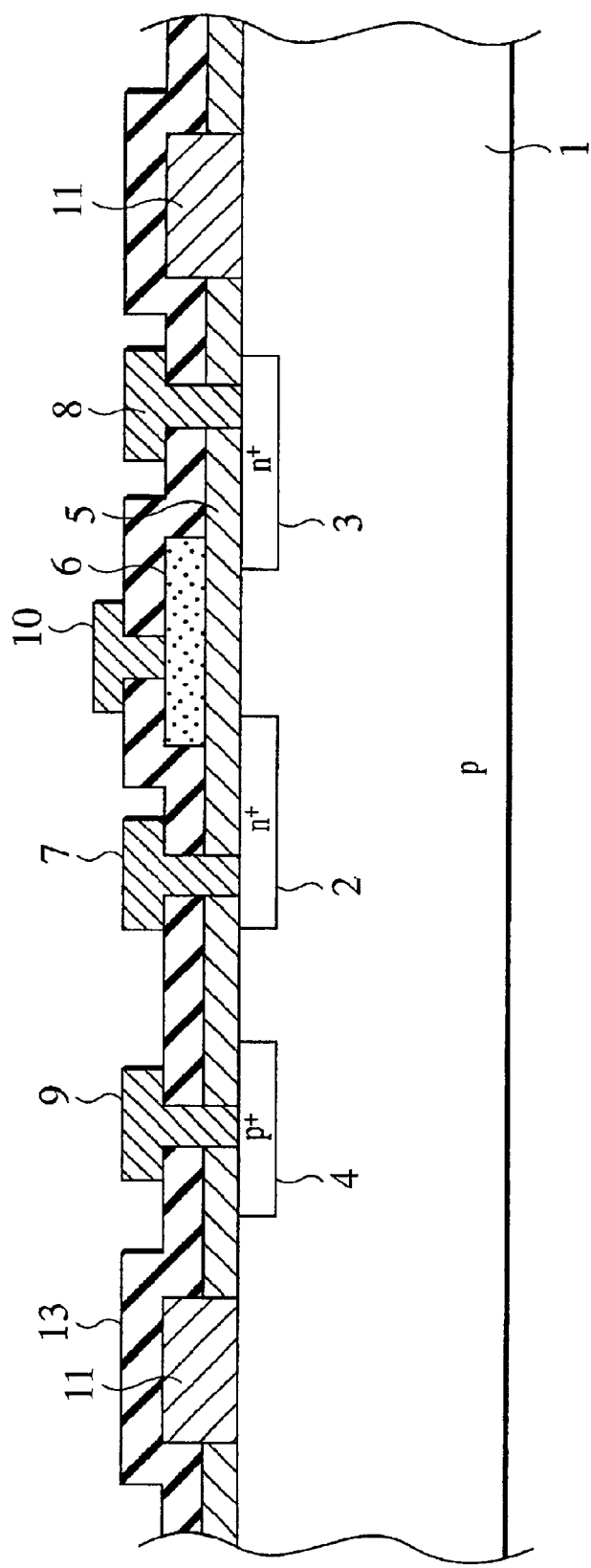
FIG. 3 is a cross sectional view illustrating a structure of a SiC-MOS transistor according to first embodiment of the present invention.

FIG. 3 shows a cross sectional view of a structure of a SiC-MOS transistor according to first embodiment of the present invention. The SiC-MOS transistor serves as one of the examples of the SiC device of the present invention. The SiC-MOS transistor of the first embodiment embraces the localized thick silicon oxide film, which is selectively grown on the surface of the SiC substrate by thermally oxidizing a surface of a Si film in a water rich oxidizing ambient, in which the $H_2O$ partial pressure is maintained more than 0.95, utilizing the $H_2O$ direct oxidation furnace shown in FIG. 1.

In FIG. 3, a localized thick thermal oxide film 11, having the thickness of about 1.0 μm, is disposed so as to construct an element isolation region on the p-type 4H—SiC substrate 1. The localized thermal oxide film 11 is formed by thermally oxidizing the Si film in the H$_2$O direct oxidation furnace shown in FIG. 1. Here, a polysilicon film is used as the Si film for the selective oxidation. The active area (or "the device region") at the surface of and in the p-type 4H—SiC substrate 1 is electrically isolated by the element isolation region from neighboring active areas (not shown). In FIG. 3, it is shown in the cross sectional view as if two localized thermal oxide films Hare existing, but the two localized thermal oxide films 11 are mutually connected in the back of the paper. That is, the localized thermal oxide film 11 encircles the active area. In the active area, n$^+$-impurity doped regions serving as a source region 2 and a drain region 3 of the SiC-MOS transistor and p$^+$-substrate contact region 4 serving as an ohmic contact region for the p-type SiC substrate are formed on the p-type 4H—SiC substrate 1 in a topology defined by a specific interval and depth.

A p-region sandwiched by the source region 2 and the drain region 3 region serves as a channel region of the SiC-MOS transistor. A thin gate oxide film 5 is laminated just above the channel region and a polysilicon gate 6 is disposed on the gate oxide film 5. From the source region 2, the drain region 3, the p$^+$-substrate contact region 4 and the polysilicon gate 6, surface link electrodes such as a source electrode 7, a drain electrode 8, a gate electrode 10 and a contact electrode 9 are extended via contact holes, which are opened in the phosphosilicate glass (PSG) film 13, respectively. The PSG film 13 serving as an interlayer insulating film covers the element isolation region and the active area disposed at the surface of the p-type 4H—SiC substrate 1. It should be noted that although in an actual SiC-MOS transistor, further, a plasma SiN film covers substantially the entire surface for scratch protection and final passivation, which is omitted in FIG. 3.

Figure 4A:
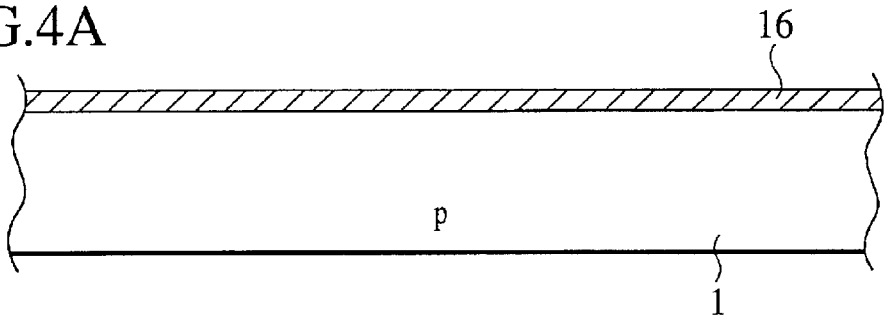
FIGS. 4A to 4P are cross sectional views illustrating a method for manufacturing the SiC-MOS transistor shown in FIG. 3.

The method for manufacturing the SiC-MOS transistor shown in FIG. 3 will be described below with reference to FIGS. 4A to 4P:

(a) In FIG. 4A, after the p-type 4H—SiC substrate 1 is washed and cleaned by the RCA washing method and the like, a blanket thermal oxide film 16 having a thickness on the order of 20 nm is formed on the surface of the p-type 4H—SiC substrate 1 by a thermal oxidation process in the oxygen added ambient. Here, "the oxygen added ambient" is defined as the oxidation ambient in which the O$_2$ gas is added so that the H$_2$O partial pressure becomes below 0.95. Ob course, "the oxygen added ambient" embraces the O$_2$ rich ambient and the prefect O$_2$ ambient, which contains 100% O$_2$ partial pressure.

(b) Then, an insulating film 17 such as the PSG film or the like is deposited to a thickness of 1 $\mu$m by chemical vapor deposition (CVD) method on the blanket thermal oxide film 16. On the insulating film 17, a photoresist film 18 is spin-coated so as to execute a photolithography process. By the photolithography process the photoresist film 18 is delineated to provide an etching mask as shown in FIG. 4B.

Figure 4B:
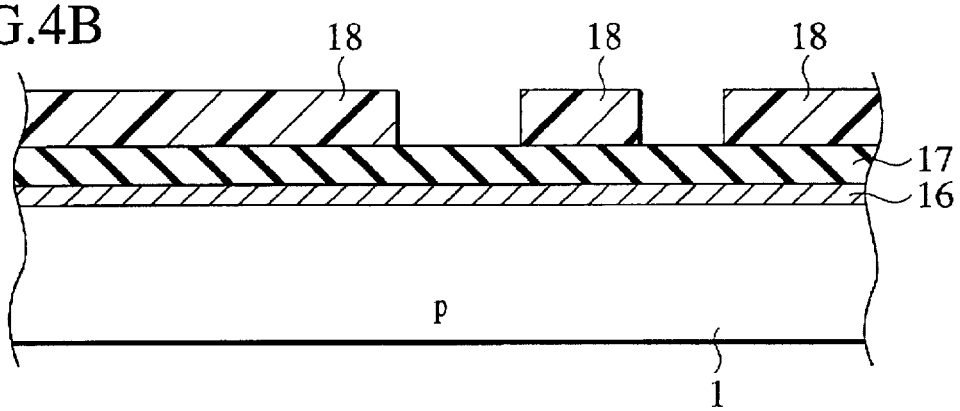
Figure 4C:
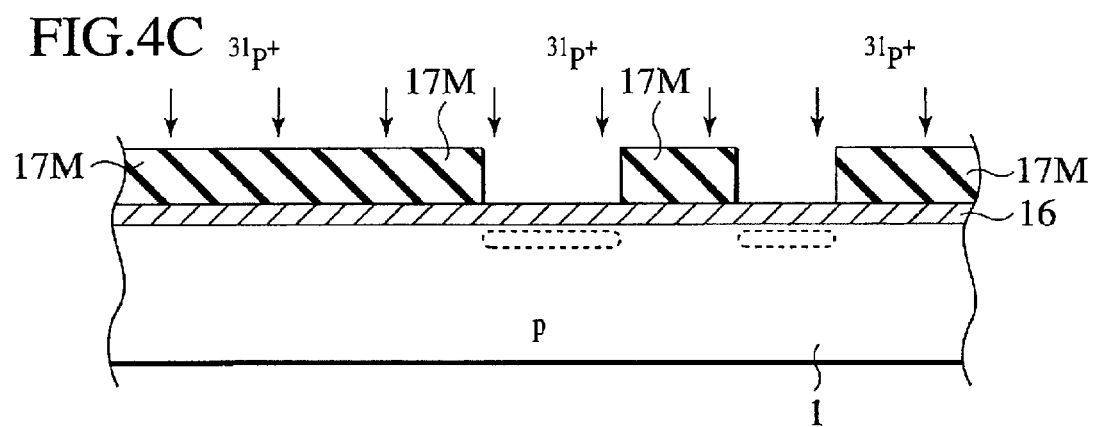

(c) By a reactive ion etching (RIE) with the etching mask 18, desired regions of the insulating film 17 are selectively opened so as to form an implantation mask 17M as shown in FIG. 4B. And n-type impurity ions are implanted through the window of the implantation mask 17M at substrate temperature of about 700° C. As the n-type impurity ions, phosphorus ions ($^{31}$P$^+$), nitrogen ions ($^{14}$N$^+$) and the like can be used.

Figure 4D:
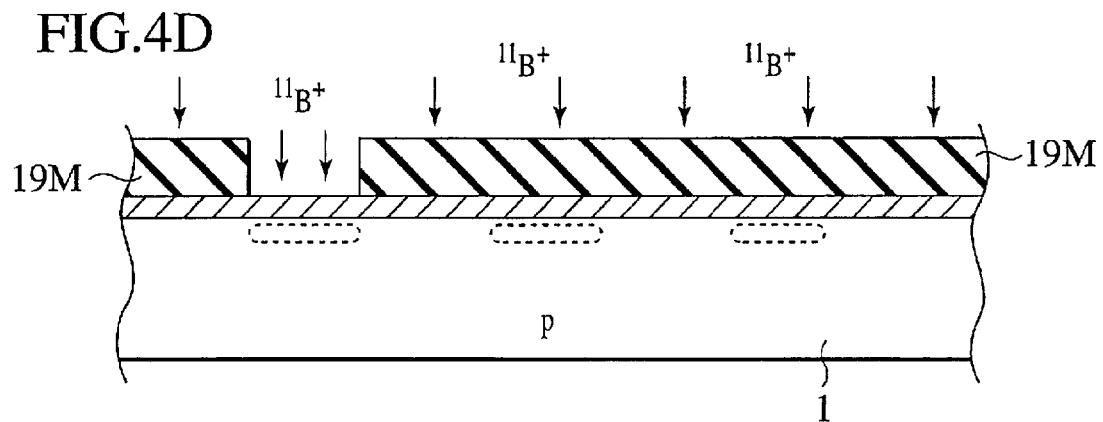
Figure 4E:
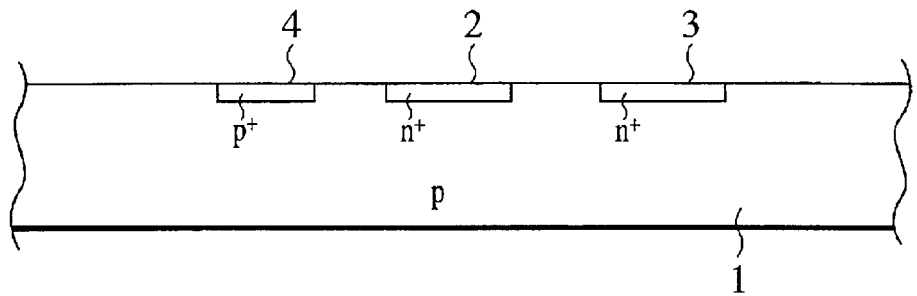

(d) Removing the implantation mask 17M, a new blanket thermal oxide film 16 is formed again on the surface of the p-type 4H—SiC substrate 1 by the thermal oxidation. Further, a new insulating film is deposited on the new blanket thermal oxide film 16. And by the similar photolithography process and RIE, the implantation mask 19M as shown in FIG. 4D is formed. And p-type impurity ions are implanted through the window of the implantation mask 19M at the substrate temperature of about 700° C. As the p-type impurity ions, boron ions ($^{11}$B$^+$), aluminum ions ($^{30}$Al$^+$) and the like can be used (e) Subsequently, the above described blanket thermal oxide film 16 and the implantation mask 19M are removed, and the p-type 4H—SiC substrate 1 is annealed at the substrate temperature of about 1500° C. so as to activate the implanted regions. Then, as shown in FIG. 4E, the n$^+$ impurity doped regions serving as the source region 2 and the drain region 3, and the p$^+$ impurity doped regions serving as the substrate contact region 4 are formed at the surface of and in the p-type 4H—SiC substrate 1.

Figure 4F:
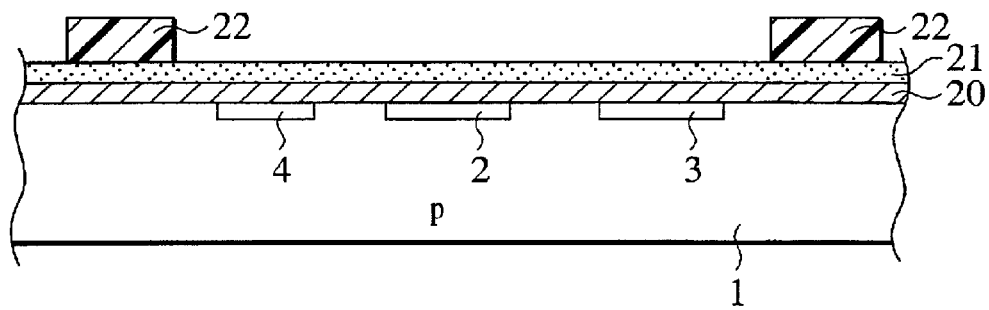

(f) As shown in FIG. 4F, a new blanket thermal oxide film 20 having a thickness on the order of 20 nm is formed on the surface of the p-type 4H—SiC substrate 1 covering the source region 2, the drain region 3 and the substrate contact region 4. Further, a polysilicon film 21 is deposited to a thickness of about 0.5 $\mu$m by a low-pressure CVD (LPCVD) method. On the polysilicon film 21, a photoresist film 22 is spin-coated so as to execute a photolithography process. By the photolithography process the photoresist film 22 is delineated to provide an etching mask as shown in FIG. 4F.

Figure 4G:
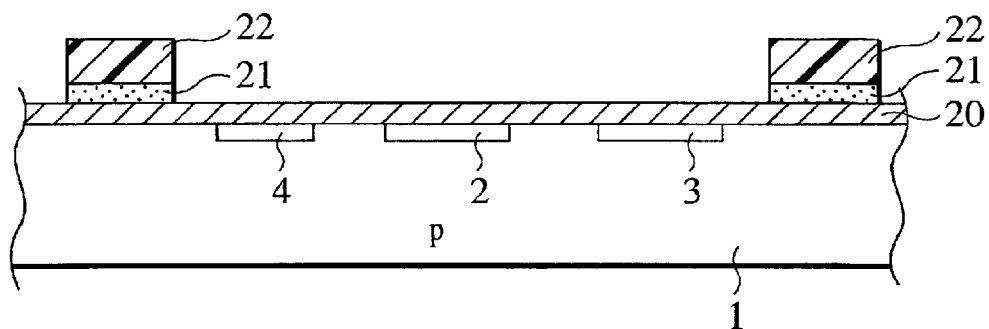
Figure 4H:
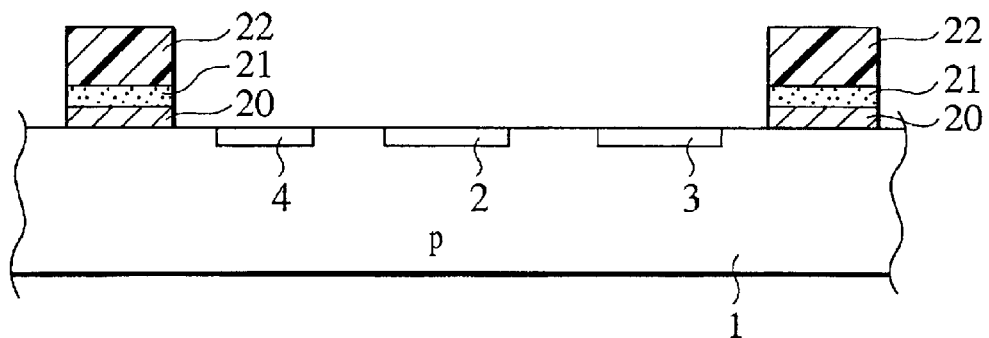
Figure 4I:
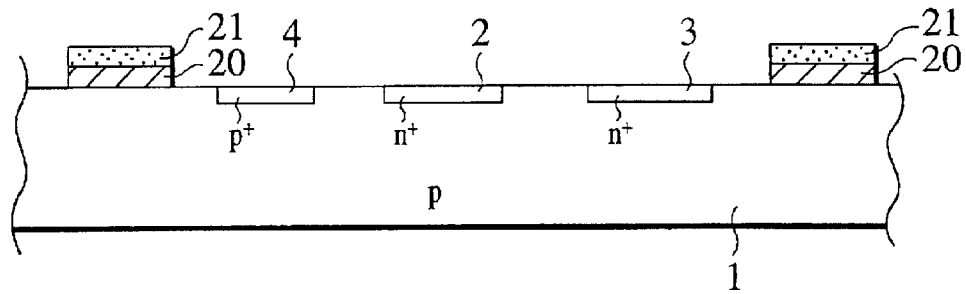

(g) Using the etching mask 22, the polysilicon film 21 is selectively removed by an anisotropic etching such as the RIE as shown in FIG. 4G, and a pattern 21 of polysilicon is selectively formed on the scheduled element isolation region. At this moment, the blanket thermal oxide film 20 serves as an etching stop layer when the anisotropic etching (RIE) is performed. Namely, the etching stop layer 20 protects the surface of the p-type 4H—SiC substrate 1 as well as the impurity doped regions 2,3 and 4 already formed up to the steps shown in FIG. 4E. It is preferable to employ the high-precision anisotropic etching so that the size of the pattern 21 to be formed is not shifted from the designed size of a resist pattern 22. Further, the blanket thermal oxide film 20 is selectively removed by diluted fluoric acid (HF) as shown in FIG. 4H. And the etching mask 22 is removed as shown in FIG. 4I.

Figure 4J:
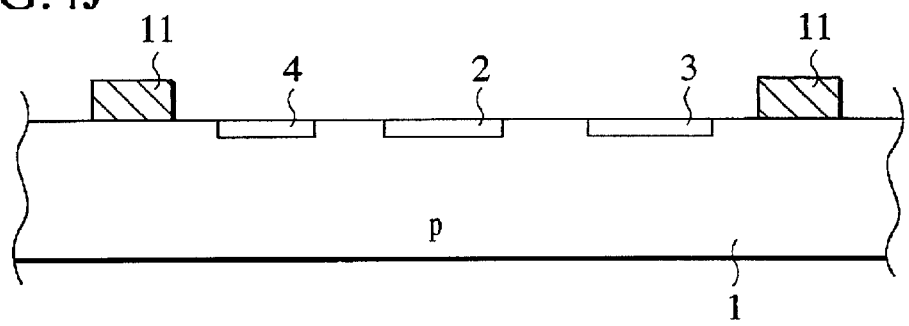

(h) FIG. 4J is a cross sectional view illustrating characteristic feature of the method for manufacturing the SiC device according to the first embodiment. As shown in FIG. 4J, a thick localized thermal oxide film 11 is formed on the element isolation region by thermally oxidizing the pattern 21 of polysilicon selectively, by utilizing the H$_2$O direct oxidation furnace shown in FIG. 1, at the substrate temperatures of 1000° C. to 1200° C. In the selective oxidation, the H$_2$O partial pressure is maintained to be more than 0.95 so as to achieve the water rich ambient, suppressing the oxidation of the surface of the p-type 4H—SiC substrate 1. As a result, only the polysilicon pattern 21 is selectively and thermally oxidized, the thick localized thermal oxide film 11 is obtained on the element isolation region as shown in FIG. 4J in a short manufacturing period. As to the other surface portions of the p-type 4H—SiC substrate 1 exposed to the oxidation ambient, since the oxidation rate of the p-type 4H—SiC substrate 1 is sufficiently suppressed, only the portions designed for the element isolation regions can be selectively oxidized for a sufficient time required for the complete oxidation of the full thickness of the polysilicon pattern 21. Then the entire polysilicon pattern 21 is selectively and perfectly oxidized. It should be noted that the silicon oxide film 20 beneath the polysilicon pattern 21 is merged into the oxidation film of the polysilicon pattern 21. The volume of polysilicon pattern 21 is apparently increased by the selective thermal oxidation. For example, in the case of the polysilicon pattern 21 having the thickness of 0.5 $\mu$m, the localized thermal oxide film 11 having the thickness of about 1.0 $\mu$m is formed. In general, since the dielectric breakdown field of the thermal oxide film is about 10 MV/cm, the breakdown voltage of about 1000 V is obtained in the case of the localized thermal oxide film 11 having the thickness of 1.0 $\mu$m.

Figure 4K:
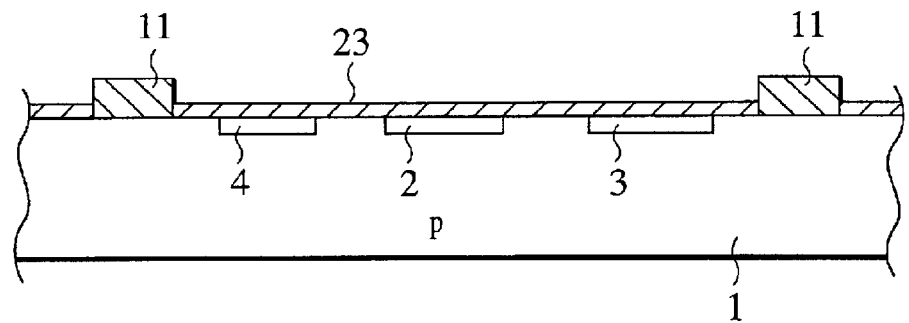

(i) As shown in FIG. 4k, the surface of the active area is covered with a sacrificial silicon oxide film 23 having the thickness of about 20 nm by thermal oxidation process in the oxygen added ambient. The sacrificial silicon oxide film 23 is formed temporarily for the purpose of making the surface of the p-type 4H—SiC substrate 1, prior to the formation of the gate oxide film 5, a cleaned and purified state.

Figure 4L:
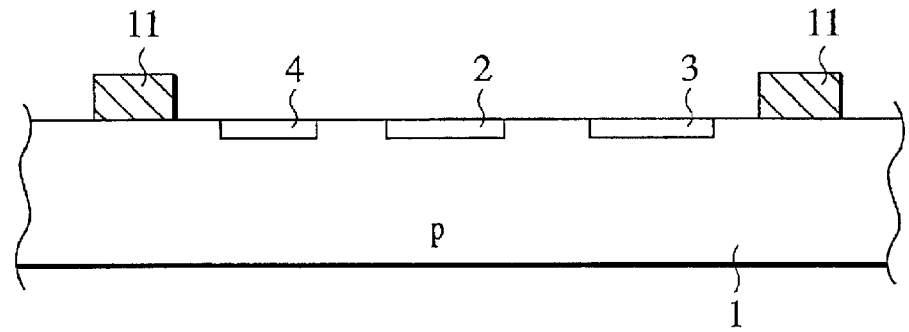
Figure 4M:
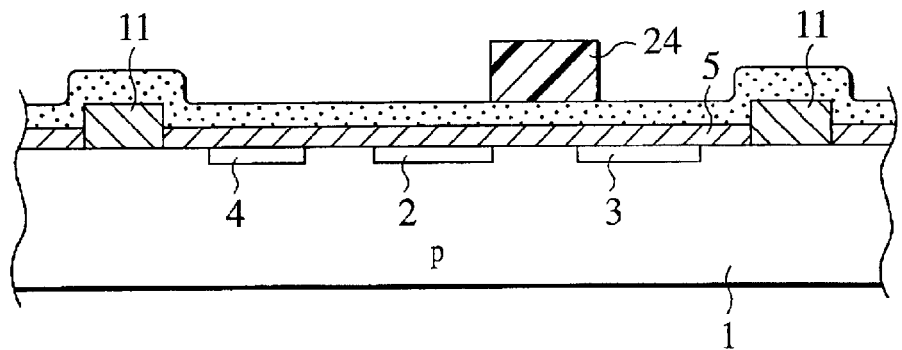

(j) Immediately after the sacrificial silicon oxide film 23 is removed by the diluted HF solution as shown in FIG. 4L, the gate oxide film 5 is formed on the surface of the active area by thermal oxidation process in the oxygen added ambient as shown in FIG. 4M. Then a polysilicon film is deposited by the LPCVD method, on the surface of the gate oxide film 5. After the polysilicon is deposited by the LPCVD method, the n$^+$-type doped-polysilicon film 6 is formed by annealing in the POCl$_3$ ambient. The n$^+$-type doped-polysilicon film 6 may be doped in situ during the deposition, or it may receive a blanket implant after deposition. On the n$^+$-type doped-polysilicon film 6, a photoresist film 24 is spin-coated so as to execute a photolithography process. By the photolithography process the photoresist film 24 is delineated to provide an etching mask as shown in FIG. 4M. The etching mask 24 is formed above the channel region sandwiched between the source region 2 and the drain region 3.

Figure 4N:
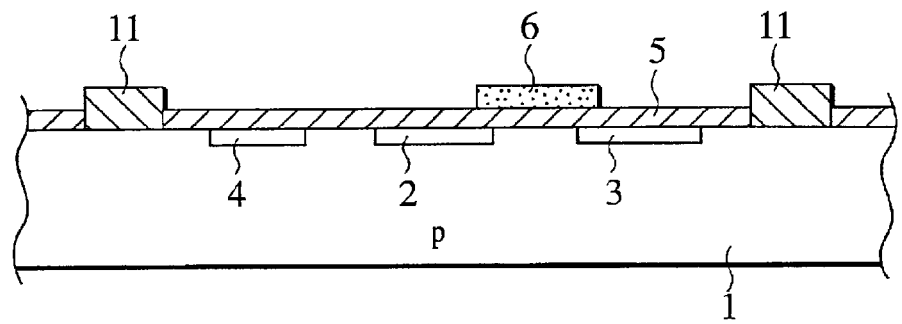

(k) By the RIE with the etching mask 24, a pattern 6 of n$^+$-type doped-polysilicon is formed so as to serve as the gate electrode of the SiC-MOS transistor. The pattern of the doped-polysilicon gate electrode 6 is so designed that the edge portions of the pattern 6 hang on the respective regions of the source region 2 and the drain region 3 as shown in FIG. 4N. At this RIE process, the gate oxide film 5 serves as the etching stop layer during etching.

Figure 4O:
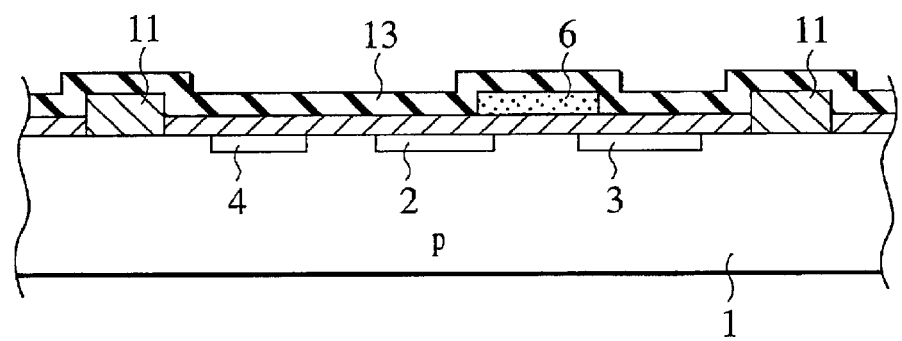
Figure 4P:
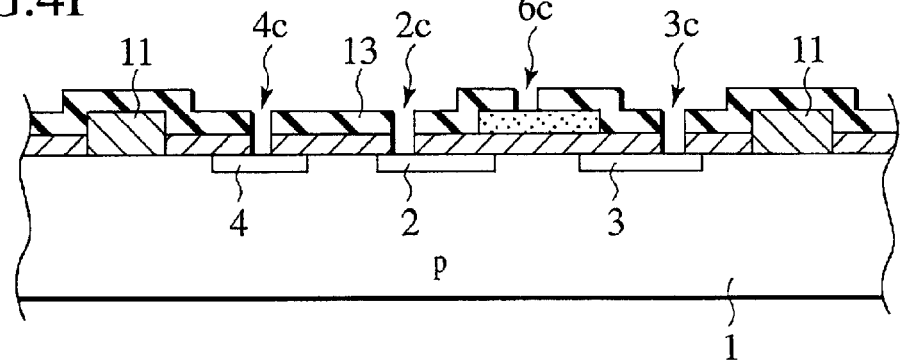

(l) Then, as shown in FIG. 4O, the PSG film 13 serving as an interlayer insulating film, is deposited by the CVD method. And, desired locations of the PSG film 13, which are disposed on the upper portions of the source region 2, the drain region 3, the substrate contact 4 and n$^+$-type doped-polysilicon pattern 6, respectively are opened so as to form contact holes 2C, 3C, 4C and 6C by photolithography/etching. On each of contact holes 2C, 3C, 4C and 6C, a metal film for forming ohmic electrodes is deposited by the vacuum evaporating or the sputtering. The metal film may be selected from nickel (Ni), titanium (Ti), aluminum (Al) or the like, or the combination of these metals. Then, as shown in FIG. 3, the source electrode 7, the drain electrode 8, the gate electrode 10 and the contact electrode 9 are formed by metallization process including the photolithography and etching. Following the delineation the metal pattern, an annealing or the sintering is added according to the necessity, and the SiC-MOS transistor of FIG. 3 is completed.

According to the method for manufacturing the SiC device of the first embodiment, the following effectiveness and technical advantages are obtained:

(1) The localized polysilicon pattern 21 is provided on the scheduled element isolation region of the SiC device, and it is designed so that only the polysilicon pattern 21 is selectively and thermally oxidized in the water rich ambient whose H$_2$O partial pressure is more than 0.95. Therefore, since the growth of the silicon oxide film is sufficiently suppressed on the surface of the SiC substrate 1 where the top surface of the active area in the SiC device is exposed, the polysilicon pattern 21 is selectively oxidized and can be sufficiently thermally oxidized until the localized thermal oxide film 11 achieves the desired film thickness. Moreover, as the surface of the SiC substrate 1 being not covered by the unwanted silicon oxide film, it is not required to have an extra process of removing the unwanted silicon oxide film from the surface of the SiC substrate 1, and the processing precision to achieve a high geometrical accuracy of the localized thermal oxide film 11 is easily improved. That is to say, the structural accuracy of the element isolation region of the SiC device is improved. If the unwanted silicon oxide film is formed on the surface of the SiC substrate 1, an extra chemical etching employing etchant such as the diluted HF solution in order to remove the unwanted silicon oxide film must be conducted. Since the chemical etching also etches the thick localized thermal oxide film 11 formed on the element isolation region of the SiC device at the same time, the desired precise film thickness of the localized thermal oxide film 11 is not obtained. In addition, a pattern size of the localized thermal oxide film 11 is changed, and the process precision of the RIE when the polysilicon pattern 21 is delineated becomes poor. Since the process precision of the polysilicon pattern 21 determines the size of the active area defined by the localized thermal oxide film 11, it is extremely important upon determining electric performance of the SiC device.

(2) Since the anisotropic RIE is employed so as to define the polysilicon pattern 21, the reduction of the size of the polysilicon pattern 21 on the order of the film thickness, which would occurred in the case of isotropic etching, can be suppressed.

(3) Since the H$_2$O direct oxidation furnace is employed in order to execute the selective thermal oxidation, the H$_2$O partial pressure in the oxidizing ambient can be efficiently maintained more than 0.95 compared to the earlier thermal oxidation furnace. In general, as a steam oxidation method referred to as "the wet oxidation", "the pyrogenic steam oxidation" and "the H$_2$O bubbling oxidation" are known. As the pyrogenic steam oxidation generates H$_2$O by combustion of H$_2$ gas and O$_2$ gas, it is necessary to supply extra O$_2$ gas for the purpose of complete combustion of H$_2$ gas in consideration of the safety. Specifically, the ratio of the flow rates of H$_2$ gas/O$_2$ gas is set less than 2.0. Therefore, the O$_2$ partial pressure in the oxidizing ambient is on the order of 0.10, and it is difficult that the $H_2O$ partial pressure is raised more than 0.95. Moreover, as to the $H_2O$ bubbling oxidation, since the $H_2O$ partial pressure is relatively reduced by the presence of the $O_2$ or $N_2$ carrier gas required to the bubbling, it is difficult that the $H_2O$ partial pressure in the oxidizing ambient is raised more than 0.95.

In the description described above, although the n-MOS transistor has been explained as an example of the SiC device, the present invention can be applied to a p-MOS transistor as shown in FIG. 5. In FIG. 5, a localized thick thermal oxide film 11, having the thickness of about 1.0 $\mu$m, is disposed so as to construct the element isolation region on the n-type 4H—SiC substrate 31. The localized thermal oxide film 11 is similarly formed by the thermal oxidization method, i.e. by thermally oxidizing the polysilicon film in the $H_2O$ direct oxidation furnace shown in FIG. 1. The element isolation region isolates an active area at the surface of and in the n-type 4H—SiC substrate 31 from neighboring active areas. In each of the active areas, $p^+$-impurity doped regions serving as a source region 32 and a drain region 33 of the SiC-MOS transistor and $n^+$-substrate 31 contact region 34 serving as an ohmic contact region for the n-type SiC substrate 31 are formed on the n-type 4H—SiC substrate 31.

An n-region sandwiched by the source region 32 and the drain region 33 serves as the channel region of the SiC-MOS transistor. A thin gate oxide film 5 is disposed just above the channel region and a polysilicon gate 6 is disposed on the gate oxide film 5. From the source region 32, the drain region 33, the $n^+$-substrate 31 contact region 34 and the polysilicon gate 6, a source electrode 7, a drain electrode 8, a gate electrode 10 and a contact electrode 9 are extended via contact holes 2C, 3C, 4C and 6C, which are opened in the PSG film 13, respectively. Here, the PSG film 13 serves as the interlayer insulating film.

Moreover, the the element isolation region of the present invention is not limited to the architecture of the MOS integrated circuit, but can be also applied to other SiC devices, or other SiC integrated circuits such as the bipolar integrated circuit, static induction transistor (SIT) integrated circuit, or the Bi-CMOS integrated circuit. The other SiC devices may include power ICs.

In FIG. 4A described above, although the blanket thermal oxide film 16 has been grown on the surface of the p-type 4H—SiC substrate 1, it will be possible that a p-type epitaxial layer is formed on an n-type 4H—SiC substrate. Moreover, it will be also possible that the impurity ions such as $^{11}B^+$, $^{30}Al^+$ ions and the like are selectively implanted into a p-type substrate or n-type substrate, followed by the drive-in anneal, so as to form a p-well structure in these substrates.

In FIG. 4F, the blanket thermal oxide film 20 was formed as the etching stop layer. However, the polysilicon film 21 can be directly deposited on the bare surface of the SiC substrate without providing the blanket thermal oxide film 16. In this case, the polysilicon pattern 21 must be delineated without damaging the surface of the SiC substrate, by photolithography/etching with the benefit of a high etching selectivity. In order to increase the selective ratio of polysilicon against SiC, it will be preferable to employ an etching gas of chlorines.

In FIG. 4K, the sacrificial oxide film 23 was formed by the thermal oxidation process in the oxygen added ambient. However, it will be also possible that during the selective thermal oxidation process of the polysilicon pattern 21 on the element isolation region at the processing stage shown in FIG. 4J, a sacrificial oxide film is simply formed in situ by adding an appropriate flow rate of $O_2$ according to the relationship between the $H_2O$ partial pressure and the thickness of the silicon oxide film shown in FIG. 2. Or the sacrificial oxide film 23 is also formed, just after the formation of the thick localized thermal oxide film 11, by completely replacing the oxidizing ambient by 100% $O_2$ gas or by $O_2$ rich ambient.

Moreover, during the selective thermal oxidation of the polysilicon pattern 21, the portion of the surface of the SiC substrate 1 located at the active area is exposed to the water rich ambient, and the exposed surface of the SiC substrate 1 is reduced by the water rich ambient. The reduction by the water rich ambient removes a surface region encompassing many crystal defects. Therefore, it will be also possible that the formation process of the sacrificial oxide film 23 is omitted and the gate oxide film 5 can be grown successively from the selective thermal oxidation process. If the process of forming the sacrificial oxide film 23 is omitted, there is no chance to expose an interface between the surface of the SiC substrate 1 and the gate oxide film 5 to the air outside of the quartz reaction tube 41, which is inevitable when the sacrificial oxide film 23 is removed by HF solution or the like. Then, a good quality of the gate oxide film 5, without embracing any contamination, can be obtained by the process sequence configured not to expose the interface to the air outside of the quartz reaction tube 41. Furthermore, the manufacturing processes of the SiC device can be simplified, and in addition, the film thickness loss of the localized thermal oxide film 11, which would occurred when the sacrificial oxide film 23 was removed, will be vanished.

The above-described selective thermal oxidation of silicon has been carried out while the $H_2O$ partial pressure of more than 0.95 is maintained using the $H_2O$ direct oxidation furnace of the present invention. It will be preferable that the $H_2O$ partial pressure in the oxidizing ambient is made 100%. In the case where $O_2$ is mixed into the oxidizing ambient, the ratio of the oxidation rate can be made more than 60 by maintaining the $H_2O$ partial pressure being at least more than 0.95. Here, the ratio of the oxidation rate is defined as the ratio of the oxidation rate of the surface of the Si substrate with respect to the oxidation rate of the surface of the SiC substrate in the same oxidizing ambient.

Figure 6A:
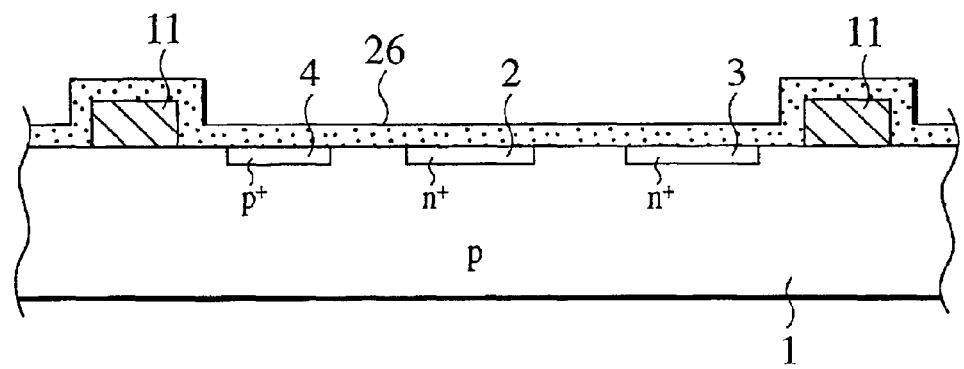
FIGS. 6A and 6B are cross sectional views illustrating the other procedures of forming a gate oxide film on a surface of SiC substrate.
Figure 6B:
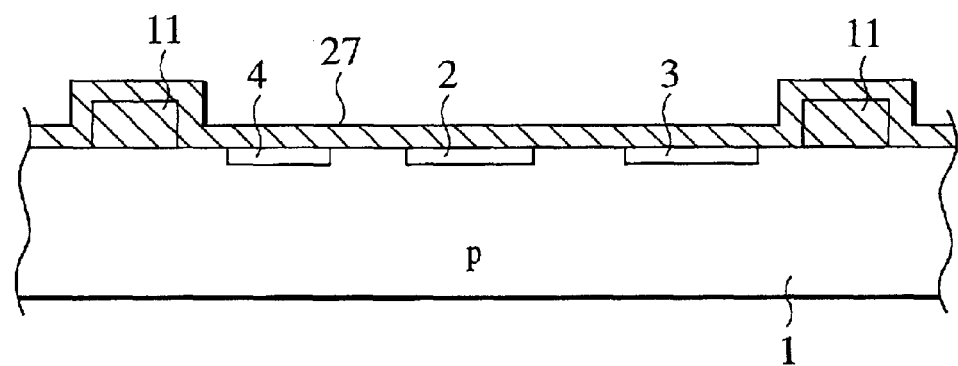

The gate oxide film 5 can be formed by a process sequence as shown in FIGS. 6A and 6B.

(a) In a stage corresponding to the cross sectional view shown in FIG. 4J described above, the thin polysilicon film 26 is deposited by the LPCVD method so that the surfaces of the source region 2, the drain region 3 and the substrate contact 4 are covered by the polysilicon film 26 as shown in FIG. 6A.

(b) Subsequently, the thin polysilicon film 26 is selectively and thermally oxidized while maintaining the $H_2O$ partial pressure in the oxidizing ambient to be more than 0.95 by employing the $H_2O$ direct oxidation furnace of the present invention. As a result, the surfaces of the source region 2, the drain region 3 and the substrate contact 4 formed at the surface of the SiC substrate 1 are covered with the thin silicon oxide film 27 as shown in FIG. 6B. The thin silicon oxide film 27 serves as the gate oxide film of the SiC-MOS transistor. As to the silicon oxide film 27, since SiC is never oxidized at the $H_2O$ partial pressure, a good quality of gate oxide film, or the gate isolating film, not including impurities inherent in the SiC substrate, is obtained. It should be noted that the thin polysilicon film 26 is deposited so that the thickness of the film after the thermal oxidation conform with the desired thickness of the gate oxide film of the SiC-MOS transistor.

(c) Then, a polysilicon film is deposited by the LPCVD method, on the surface of the silicon oxide film 27. After the polysilicon is deposited by the LPCVD method, the n$^+$-type doped-polysilicon film 6 is formed by annealing in the POCl$_3$ ambient. The process sequences after the process shown in FIG. 6B are the same as the process sequences shown in FIGS. 4M to 4P described above.

(Second Embodiment)

Figure 7:
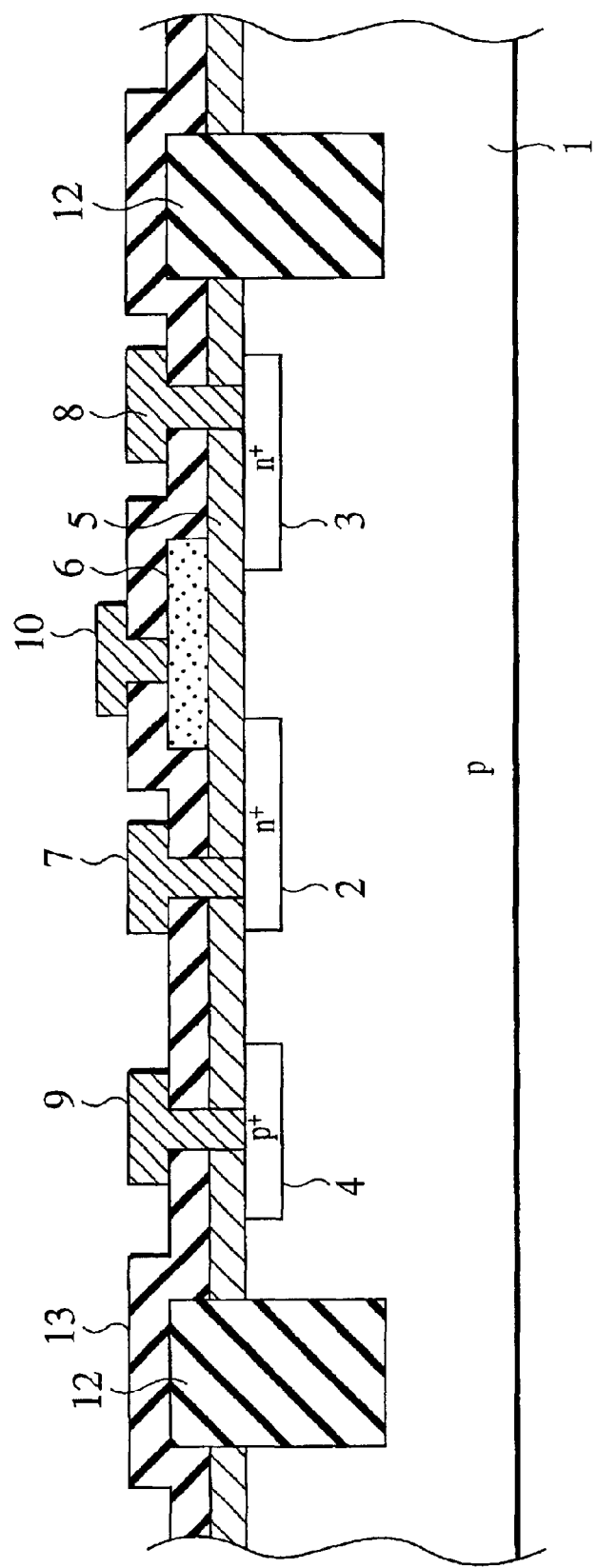
FIG. 7 is a cross sectional view illustrating a structure of a SiC-MOS transistor according to second embodiment of the present invention.

The second embodiment of the present invention is substantially similar to the first embodiment described above. That is, a polysilicon film deposited on the surface of the SiC substrate 1 substrate is selectively oxidized by the thermal oxidization in the water rich ambient, in which the H$_2$O partial pressure in the oxidizing ambient being maintained to be more than 0.95. FIG. 7 is a cross sectional view illustrating a structure of the SiC-MOS transistor according to the second embodiment of the present invention. As shown in FIG. 7, a thick localized thermal oxide film 12 is formed in a trench dug at the surface of a p-type 4H—SiC substrate 1. The thick localized thermal oxide film 12 in the trench serves as the element isolation region at the surface of and in the p-type 4H—SiC substrate 1. In the second embodiment, the trench has been previously provided at the position scheduled for the element isolation region in the p-type 4H—SiC substrate 1, and the localized thermal oxide film 12 is formed by thermally oxidizing polysilicon filled in this trench. Similarly to the SiC-MOS transistor according to the first embodiment, the active area in the p-type 4H—SiC substrate 1 is electrically isolated from other neighboring active areas by the element isolation region. In the isolated active area, a source region 2, a drain region 3 and a p$^+$-substrate contact region 4 are formed respectively.

The depth of the element isolation region is appropriately determined by geometry of the SiC device. The ways of expansion of depletion layers generated by a voltage applied to the drain region 3 are different, for example, in a planar-MOS transistor forming a channel region at the surface of the p-type 4H—SiC substrate 1 and in a vertical MOS transistor in which the drain current flows vertically to the bottom surface of the p-type 4H—SiC substrate 1. Hence, in general, in the case of the planar-MOS transistor as shown in FIG. 7, the element isolation region is formed in a shallower depth, and in the case of the vertical MOS transistor, the element isolation region is formed in a deeper depth.

It should be noted that in FIG. 7, the illustration of the final passivation film such as plasma SiN film or the like which covers the surface of the entire SiC device is omitted.

The method for manufacturing the SiC-MOS transistor of FIG. 7 will be described below with reference to FIGS. 8A to 8G.

Figure 8A:
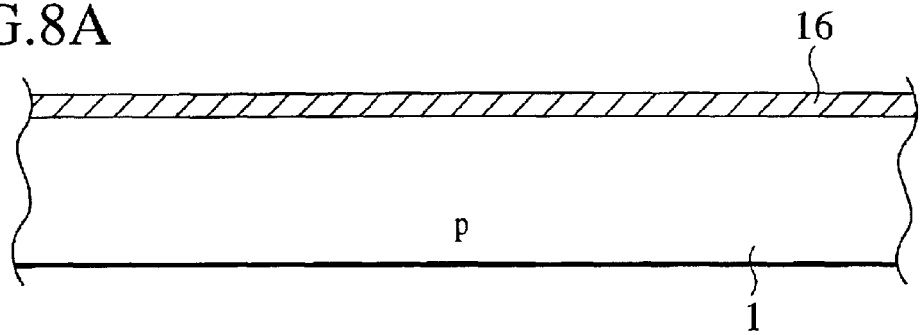
FIGS. 8A to 8G are cross sectional views illustrating a method for manufacturing the SiC-MOS transistor shown in FIG. 7.

(a) In FIG. 8A, after the p-type 4H—SiC substrate 1 is washed and cleaned by the RCA washing method, the blanket thermal oxide film 16 having a thickness on the order of 20 nm is formed on the surface of the p-type 4H—SiC substrate 1 by the thermal oxidation process in the oxygen added ambient.

Figure 8B:
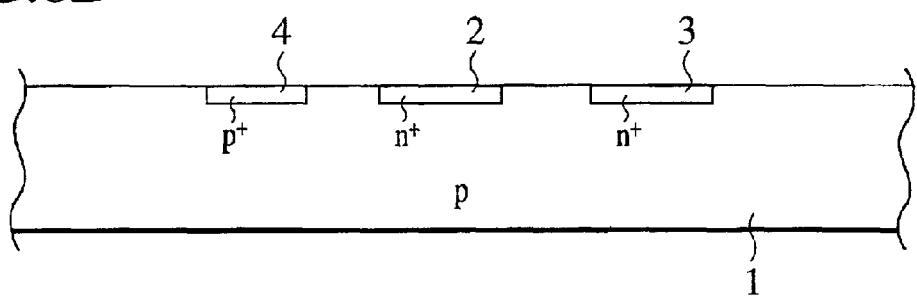

(b) Then the source region 2, the drain region 3 and p$^+$-substrate contact region 4 are formed at the surface of and in the p-type 4H—SiC substrate 1 as shown in FIG. 8B. The process sequence forming the source region 2, the drain region 3 and p$^+$-substrate contact region 4 is exactly same as the process sequence explained with FIGS. 4B to 4D. Namely, a CVD film 17 such as the PSG film or the like is deposited on the blanket thermal oxide film 16 to a thickness of about 1 $\mu$m by the CVD method. And desired portions of the CVD film is opened by the photolithography/etching so as to form an implant mask 17M, and n-type impurity ions such as $^{31}$P$^+$, $^{14}$N$^+$ and the like are implanted through the windows formed in the CVD film, while the p-type 4H—SiC substrate 1 is heated at the substrate temperature of about 700° C. Similarly, the deposition of CVD film and photolithography/etching are carried out again, and desired portions are opened so as to form another implant mask 19M. And the p-type impurity ions such as $^{11}$B$^+$, $^{30}$Al$^+$ are implanted through the implant mask 19M to the surface of the p-type 4H—SiC substrate 1, while the p-type 4H—SiC substrate 1 is heated up to the substrate temperature of about 700° C. Subsequently, the blanket thermal oxide film 16 and the CVD film 19M are removed, and the implanted regions are activated by annealing at substrate temperature of about 1500° C., the source region 2, the drain region 3 and p$^+$-substrate contact region 4 are formed as shown in FIG. 8B.

Figure 8C:
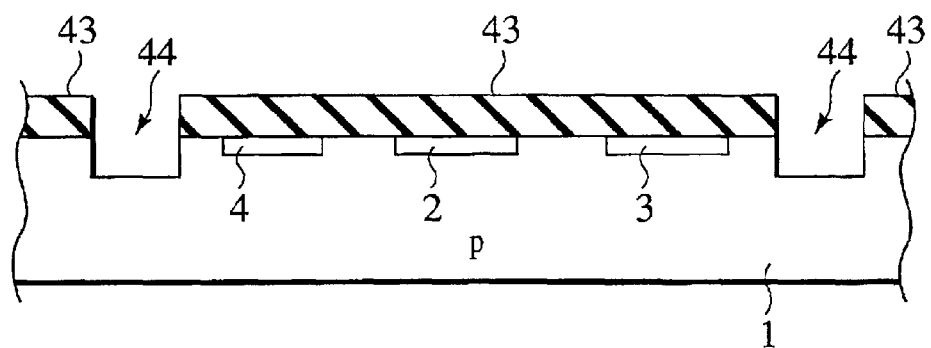

(c) As shown in FIG. 8C, a PSG film 23 is formed on the surface of the p-type 4H—SiC substrate 1 by the CVD method. On the PSG film 23, a photoresist film is spin-coated so as to execute a photolithography process. By the photolithography process the photoresist film is delineated to provide an etching mask for PSG film etching. And a portion of PSG, which is scheduled to be the element isolation region, is selectively removed by the etching so as to form an etching mask 43 for trench formation. In this case, the formation of the etching mask 43 is, for example, carried out by RIE. Subsequently, trench formation using the etching mask 43 is carried out by RIE, and a trench 44 having a desired depth with vertical sidewall is formed. Since the depth of the trench 44 dug by the RIE is substantially equivalent to the depth of the element isolation region, that is to say, the thickness of the localized thermal oxide film 12 to be buried in the trench 44, the depth is appropriately determined by a designed geometry of the SiC device.

Figure 8D:
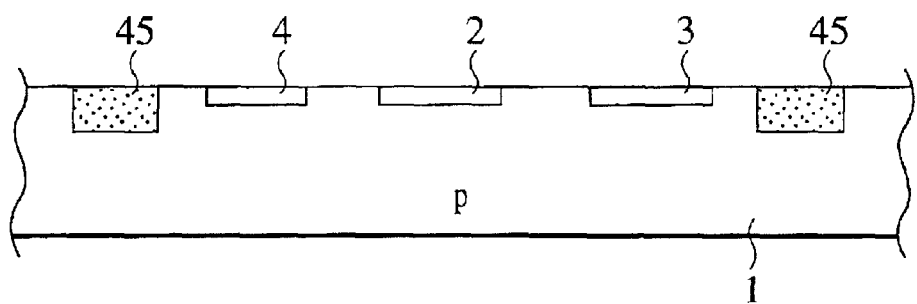

(d) As shown in FIG. 8D, the etching mask 43 is removed by chemical etching, and a polysilicon film 45 is deposited so as to bury the trench 44 by the LPCVD method. The surface of the p-type 4H—SiC substrate 1 is planarized by etch back, and the polysilicon film 45 is formed only in the trench 44 which is defined as the element isolation region. It will be preferable that an etching gas of chlorines is employed for the etch back process in order to increase the selective ratio of polysilicon against SiC. Chemical mechanical polishing (CMP) can be used for planarizing and burying the polysilicon film 45 into the trench 44

Figure 8E:
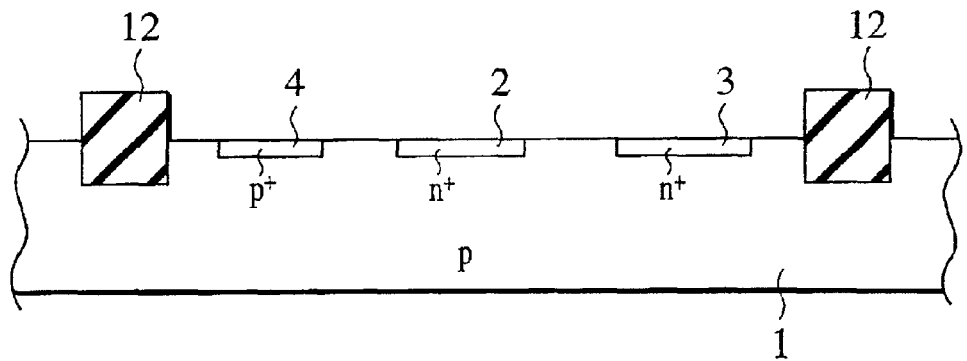

(e) FIG. 8E is a cross sectional view illustrating a characteristic feature of the manufacturing method of the second embodiment. As shown in FIG. 8E, the thick localized thermal oxide film 12 is formed in the element isolation region by selectively and thermally oxidizing the polysilicon film 45. The selective thermal oxidation is carried out at substrate temperatures of 1000° C.–1200° C. in the water rich ambient, maintaining the H$_2$O partial pressure in the oxidizing ambient to be more than 0.95 by employing the H$_2$O direct oxidation furnace shown in FIG. 1. As a result, only the polysilicon film 45 is selectively and thermally oxidized and the thick localized thermal oxide film 12 is obtained at the element isolation region. Since the volume of polysilicon is increased by the thermal oxidation, the height of the localized thermal oxide film 12 is higher than that of the surface level of the p-type 4H—SiC substrate 1.

Figure 8F:
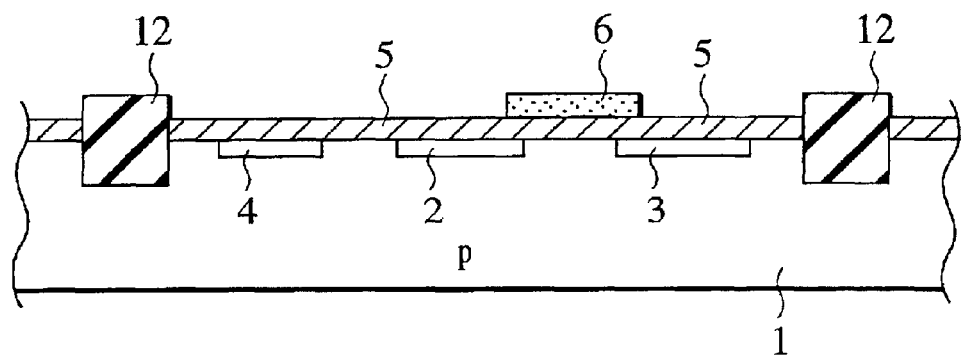

(f) Turning back to FIG. 4K of the first embodiment, the surface of the active area is covered with a silicon oxide film 23. That is to say, the thermal oxidation process in the oxygen added ambient forms the sacrificial oxide film 23 having a thickness of about 20 nm. And the covered sacrificial oxide film 23 is immediately removed by the diluted HF solution. After removing the sacrificial oxide film 23, the gate oxide film 5 is formed on the surface of the active area by the thermal oxidation process in the oxygen added ambient as shown in FIG. 8F. And a polysilicon film 6 is deposited by the LPCVD method on the gate oxide film 5. After the polysilicon film 6 is deposited, the polysilicon film 6 is annealed in the POCl$_3$ ambient, and n$^+$-type doped-polysilicon film 6 is formed. The pattern 6 of n$^+$-type doped-polysilicon is formed by photolithography/etching so as to form the doped-polysilicon gate electrode 6. The edge portions of the doped-polysilicon gate electrode 6 hang on the respective regions of the source region 2 and the drain region 3. At the delineation of the doped-polysilicon gate electrode 6, the gate oxide film 5 serves as an etching stop layer protecting the over-etching.

Figure 8G:
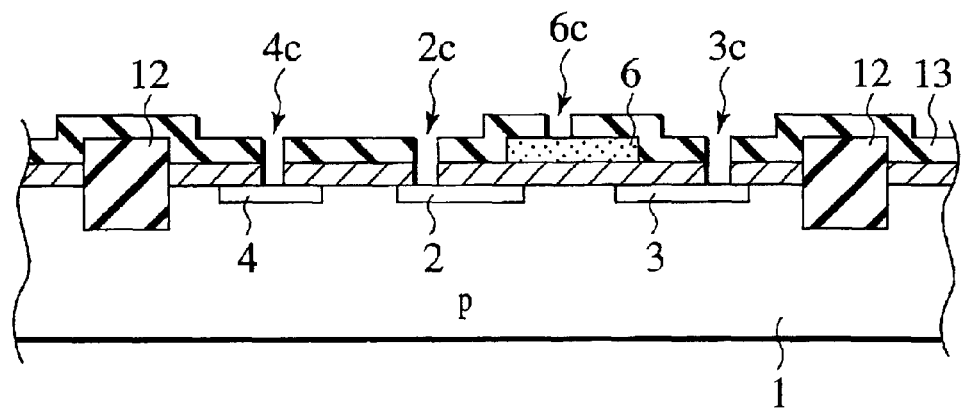

(g) As shown in FIG. 8G, the PSG film 13, which serves as the interlayer insulating film, is deposited by the CVD method. And, desired locations of the PSG film 13 disposed at the upper portions of the source region 2, the drain region 3, the substrate contact 4 and n$^+$-type doped-polysilicon pattern 6, respectively are opened so as to form contact holes 2C, 3C, 4C and 6C by photolithography/etching. On each of contact holes 2C, 3C, 4C and 6C, a metal film for forming ohmic electrodes is deposited by the vacuum evaporating or the sputtering. The metal film may be selected from Ni, Ti, Al or the like, or the combination of these metals. Then, as shown in FIG. 7, the source electrode 7, the drain electrode 8, the gate electrode 10 and the contact electrode 9 are formed by metallization process including the photolithography and etching. Following the delineation the metal pattern, an annealing or the sintering is added according to the necessity, and the SiC-MOS transistor of FIG. 7 is completed.

According to the second embodiment, the polysilicon film 45 buries the trench 44 at the element isolation region, and is selectively and thermally oxidized to obtain the localized thermal oxide film 12, similarly to the first embodiment. Here, the surface of the SiC substrate 1 on which the active area is exposed can be prevented from being covered by unrequited silicon oxide film, resulting that the extra process of removing the unrequired silicon oxide film from the surface of the SiC substrate 1 becomes unnecessary. And the process accuracy of the element isolation region is improved. Since the sidewall of the trench 44 and the bottom portion of the trench 44 are neither covered by the silicon oxide film, the process accuracy of the element isolation region is determined by the geometry of the trench 44.

(Third Embodiment)

The third embodiment of the present invention is characterized in that generation of charge in a gate oxide film and the charge density at interface state are reduced by annealing the gate oxide film in the water rich ambient, in which the H$_2$O partial pressure is maintained more than 0.95, after the gate oxide film is formed by thermal oxidation in the oxygen added ambient.

Figure 9:
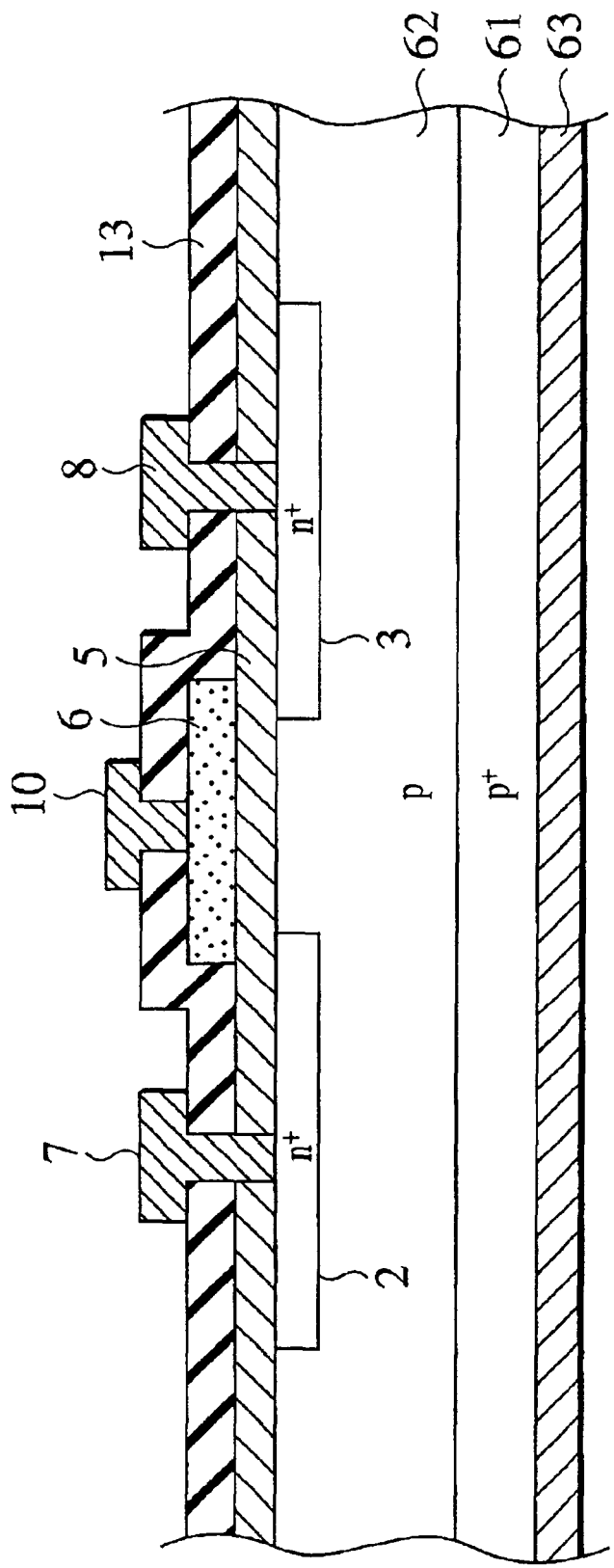
FIG. 9 is a cross sectional view illustrating a structure of a SiC-MOS transistor according to third embodiment of the present invention.

FIG. 9 is a cross sectional view illustrating an n-MOS transistor according to the third embodiment of the present invention. In FIG. 9, on the top surface of a p-type 4H—SiC substrate 61, a p-type epitaxial layer 62 is disposed, and a source region 2, a drain region 3, a gate oxide film 5 are formed at the top surface of and in the p-type epitaxial layer 62, respectively. On the gate oxide film 5, a gate electrode 10 is formed. From the source region 2, the drain region 3, the gate electrode 10, surface link electrodes such as a source electrode 7, a drain electrode 8, a gate electrode 10 are drawn via contact holes opened in a PSG film 13, respectively. A substrate electrode 63 encompassing metal film is formed at the bottom surface of the p-type 4H—SiC substrate 61.

The method for manufacturing the SiC-MOS transistor shown in FIG. 9 will be described below with reference to FIGS. 10A to 10E.

Figure 10A:
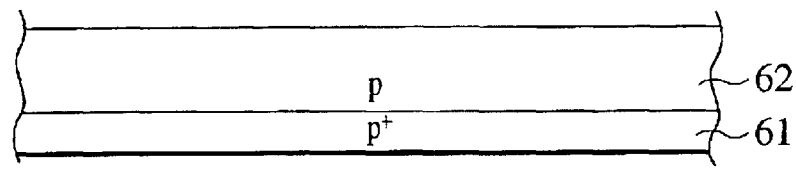
FIGS. 10A to 10E are cross sectional views illustrating a method for manufacturing the SiC-MOS transistor shown in FIG. 9.

(a) As shown in FIG. 10A, a p-type epitaxial layer 62 is grown to a thickness of about 8 μm on the top surface of the p-type 4H—SiC substrate 61. The impurity concentration of the p-type epitaxial layer 62 is lower than that of the p-type 4H—SiC substrate 61. Here, the first principal surface of the p-type 4H—SiC substrate 61 on which the p-type epitaxial layer 62 is grown is defined as "the top surface" of the p-type 4H—SiC substrate 61, and the second principal surface of the p-type 4H—SiC substrate 61 opposing to the first principal surface is defined as "the bottom surface". The conductivity types and impurity concentrations determining the resistivities of the p-type 4H—SiC substrate 1 and the p-type epitaxial layer 62 are appropriately selected according to a manufacturing information prescribing the desired electric performance.

Figure 10B:
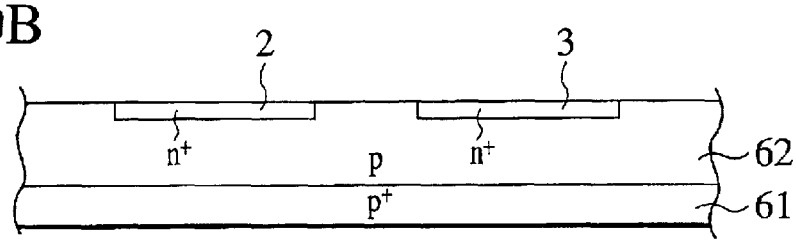

(b) As shown in FIG. 10B, the source region 2 and the drain region 3 are formed at the top surface of and in the p-type epitaxial layer 62. The process sequence for forming the source region 2 and the drain region 3 is similar to the process sequence explained in the first embodiment. Turning back to FIG. 4B, a CVD film 17 is deposited on the blanket thermal oxide film 16, which is grown on the top surface of the p-type epitaxial layer 62. And desired portions of the CVD film is opened by the photolithography/etching so as to form an implant mask 17M, and n-type impurity ions such as $^{31}P^+$, $^{14}N^+$ and the like are implanted into the p-type epitaxial layer 62 through the windows formed in the implant mask 17M, while the p-type 4H—SiC substrate 61 is heated at the substrate temperature of about 700° C. as shown in FIG. 4C. Similarly, the deposition of CVD film and photolithography/etching are carried out again, and desired portions are opened so as to form another implant mask 19M. And the p-type impurity ions such as $^{11}B^+$, $^{30}Al^+$ are implanted through the implant mask 19M to the surface of the p-type epitaxial layer 62, while the p-type 4H—SiC substrate 61 is heated up to the substrate temperature of about 700° C. as shown in FIG. 4D. Subsequently, the blanket thermal oxide film 16 and the CVD film 19M are removed by the diluted HF solution, and the implanted regions are activated by annealing at substrate temperatures of 1000° C.–1700° C., the source region 2, the drain region 3 and p$^+$ substrate contact region 4 are formed at the top surface of and in the p-type epitaxial layer 62 as shown in FIG. 10B.

Figure 10C:
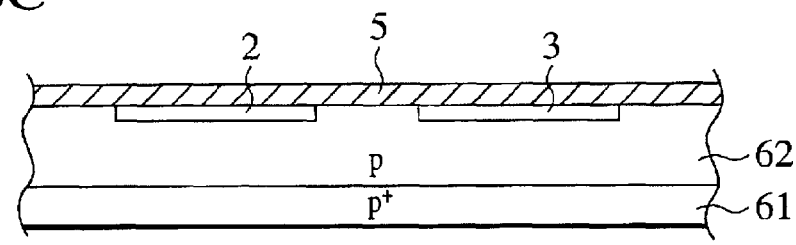

(c) As shown in FIG. 10C, after the surface of the p-type epitaxial layer 62 is washed and cleaned by solutions such as acid and alkaline solutions, the thermal oxide film having a thickness of a few tens of nm, specifically, a sacrificial oxide film is formed (See FIG. 4K). The film thickness of the sacrificial oxide film 23, the substrate temperature and the oxidation ambient during the formation of the sacrificial oxide film 23 are appropriately determined in view of other processes conditions such as the surface roughness, the washing condition, and the drying up condition of the surface of the p-type epitaxial layer 62 and the like. The formed sacrificial oxide film 23 is immediately removed by the diluted HF solution (See FIG. 4L). The surface of the p-type epitaxial layer 62 from which the sacrificial oxide film 23 is removed is washed and cleaned by solutions such as acid, alkaline solutions according to the necessity. Then, for example, the gate oxide film 5 having a thickness of about 50 nm is formed on the top surface of the active area by thermally oxidizing for about thirteen hours in the $O_2$ rich ambient or the oxygen added ambient, namely the mixture of $O_2$ and $H_2O$, at substrate temperature of about 1100° C. In general, the film thickness of the gate oxide film 5 is determined by the electric characteristics such as a gate voltage of the objected MOS transistor and the like.

(d) The following process after the formation of the gate oxide film 5 manifests a characteristic feature of the method for manufacturing the SiC device according to the third embodiment. That is, after the gate oxide film 5 is formed in the $H_2O$ direct oxidation furnace of the present invention shown in FIG. 1, the substrate temperature is lowered in order to take out the p-type epitaxial layer 62 from the quartz reaction tube 41 of the $H_2O$ direct oxidation furnace shown in FIG. 1. In the process of this lowering the substrate temperature, the supply of the oxidizing ambient ($O_2$ or the mixture of $O_2$ and $H_2O$) within the quartz reaction tube 41 is stopped once. And subsequently, the $H_2O$ is supplied into the quartz reaction tube 41. The gate oxide film 5 is annealed at substrate temperature of about 700° C.–1050° C., while controlling the supply of ultra-pure water so as to achieve the water rich ambient, maintaining the $H_2O$ partial pressure more than 0.95. The annealing is called as "the post oxidation anneal (POA) ". The preferable POA temperature lies between 850° C.–1000° C. It is more preferable that the gate oxide film 5 is annealed at substrate temperature of about 950° C. for about 60 minutes in the water rich ambient. Further, the POA can be executed at the same substrate temperature of 1100° C., at which the gate oxide film 5 grown, for five to ten minutes. The generation of interface state is efficiently reduced without newly forming a silicon oxide film by the POA of the gate oxide film 5 in the water rich ambient. After the POA, the supply of ultra-pure water within the quartz reaction tube 41 is stopped, and the water rich ambient is changed to an inert gas ambient such as $N_2$ gas or the like, and the formation process of the gate oxide film 5 finishes.

Figure 10D:
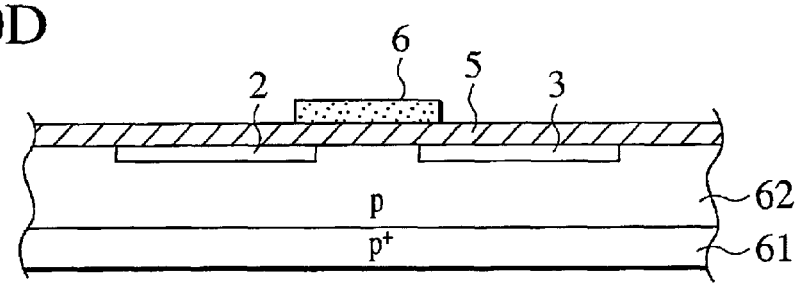

(e) As shown in FIG. 10D, above the channel region in the p-type epitaxial layer 62 sandwiched between the source region 2 and the drain region 3, the doped-polysilicon gate electrode 6 having a lower resistivity by doping phosphorus atoms in a higher concentration is delineated. The edge portions of the doped-polysilicon gate electrode 6 hang on the source region 2 and the drain region 3. As a result, a MOS structure having the doped-polysilicon gate electrode 6, the gate oxide film 5 and the p-type epitaxial layer 62 is formed. Instead of the doped-polysilicon gate electrode 6, the metal gate electrode made of refractory metal such as tungsten (W), molybdenum (Mo), platinum (Pt), cobalt (Co), titanium (Ti) and nickel (Ni) can be used. The refractory metal silicide such as $WSi_2$, $MoSi_2$ are also employable for the gate electrode. Further, aluminum (Al) can be used for the gate electrode. The metal gate electrode can be used as a single layer of one of above materials or in the laminated layers structure, combining different metal layers selected from above materials.

Figure 10E:
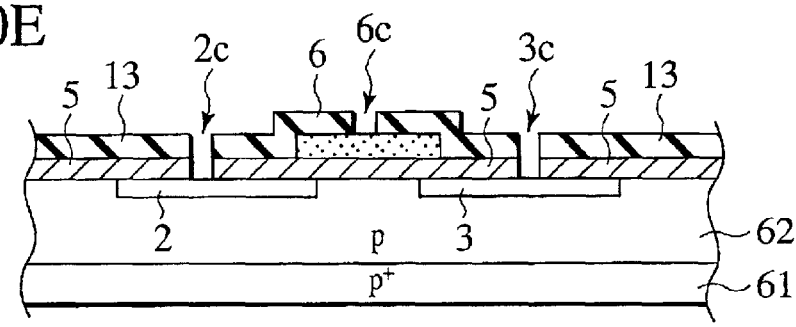

(f) As shown in FIG. 10E, the silicon oxide film 13 such as the PSG film and the like is deposited as the interlayer insulating film on the top surface of the doped-polysilicon gate electrode 6 by the CVD method. Desired positions of the silicon oxide film 13 above the source region 2, the drain region 3 and the gate electrode 10 are opened respectively so as to form a source contact hole 2C, a drain contact hole 3C and a gate contact hole 6C by photolithography/etching. At the source contact hole 2C, the drain contact hole 3C and the gate contact hole 6C, a metal film made of Ni, Ti, Al or Pt and the like is deposited in a single layer or in laminated structure. Then, as shown in FIG. 9, the surface link electrodes such as the source electrode 7, the drain electrode 8 and the gate electrode 10 are formed by metallization process including the photolithography and etching. In general, in order to reduce the leakage current between the surface link electrodes 7, 8 and 10 and to protect surface scratch, the entire surface of the SiC device is covered by the final passivation film such as the PSG film, however, in FIG. 9, the illustration of the final passivation film is omitted.

(g) Then the thermal oxide film, polysilicon film and the like unintentionally deposited on the bottom surface of the p-type 4H—SiC substrate 61 during the above process sequence are removed by etching so as to expose a clean surface. On the bottom surface of the p-type 4H—SiC substrate 61, a single layer metal film made of one of Ni, Ti, Al, Pt and the like is deposited as shown in FIG. 9. Or the laminated layers structure encompassing at least two of materials selected from Ni, Ti, Al, Pt and the like is deposited on the bottom surface of the p-type 4H—SiC substrate 61. The deposited metal film on the bottom surface of the p-type 4H—SiC substrate 61 becomes the substrate electrode 63 of the SiC-MOS transistor. Finally, in order to form ohmic contacts between the surface link electrodes 7, 8, 10 and the top surface the p-type epitaxial layer 62 as well as between the substrate electrode 63 and the bottom surface of the p-type 4H—SiC substrate 61, an annealing is carried out in the hydrogen ($H_2$) or nitrogen ($N_2$) ambient or the mixture of these gases at substrate temperatures of 900° C. to 1000° C., the SiC-MOS transistor of the FIG. 9 is completed.

Figure 11:
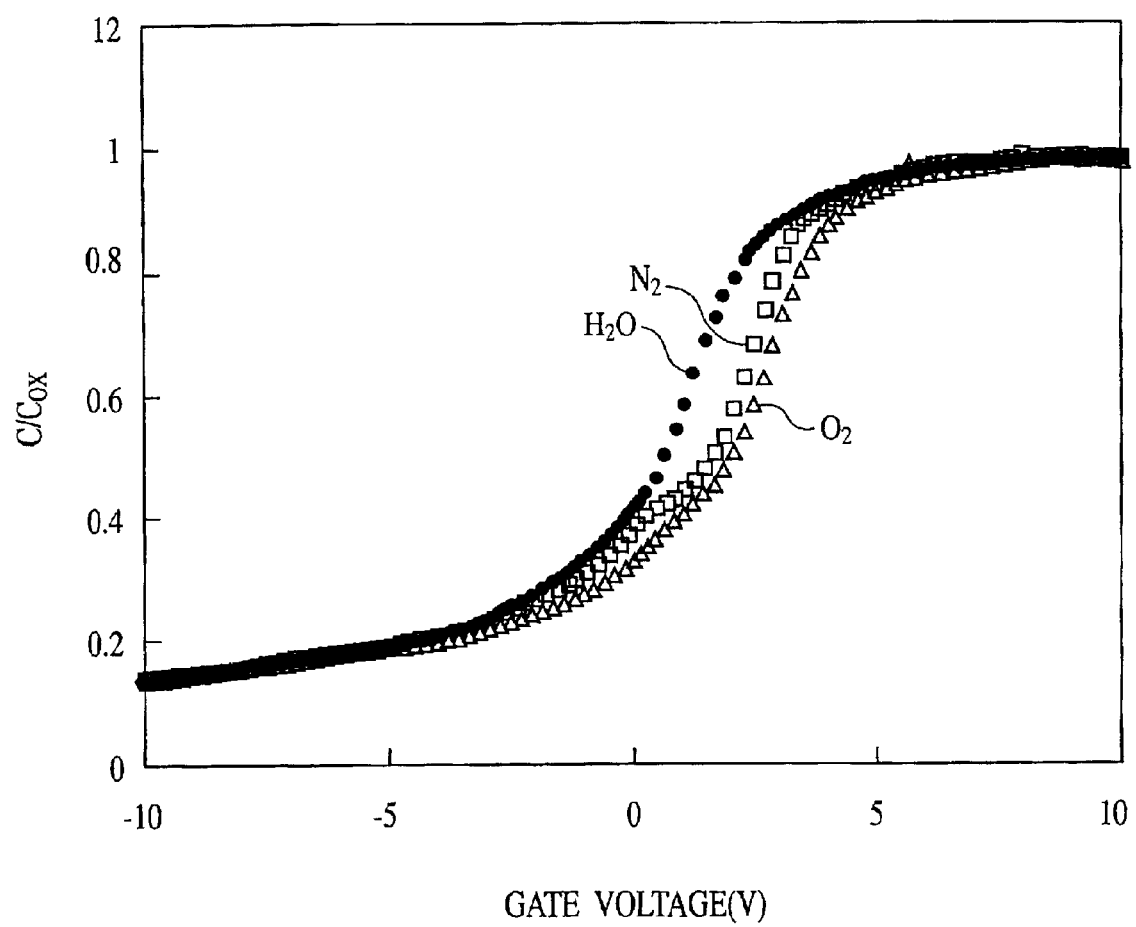
FIG. 11 is a diagram showing reductions of charge generation in silicon oxide films by post oxidation anneals.

Moreover, as for the formation of metal film and the ohmic contact between the metal film and the SiC substrate or the p-type epitaxial layer 62, there are various methodologies concerning with the manufacturing processes, and the process sequence mentioned above is an example of those methodologies FIG. 11 is a diagram showing the reduction of charge generation in a silicon oxide film, which has received the POA in the water rich ambient such that the $H_2O$ partial pressure is held larger than 0.95 at substrate temperature of 950° C. In FIG. 11, the abscissa denotes an applied voltage to the gate electrode. The ordinate denotes a normalized capacitance $C/C_{OX}$ of the MOS capacitor constructed by the gate electrode, the gate oxide film and the SiC substrate (or the p-type epitaxial layer). The curve denoted by filled circles represent the C-V curve of the MOS capacitor, which has received the POA under the condition that the $H_2O$ partial pressure is about 1.0. The curve denoted by open quadrangles represents the C-V curve of the MOS capacitor, which has received the POA processed in $N_2$ ambient. The curve denoted by open triangles represents the C-V curve of the MOS capacitor, which has received the POA processed in dry $O_2$ ambient. It should be noted that the thickness of the silicon oxide depends on the POA ambient in which the POA process is carried out. The measured capacitance vales are normalized by dividing corresponding thicknesses of the silicon oxide films, which varies depending on respective POA ambients, so that the comparison can be performed under the same conditions in FIG. 11.

As shown in FIG. 11, the C-V curve received the POA with $O_2$ ambient is shifted to the positive voltage direction and the flat band voltage $V_{fb}$ shifts same direction. If three C-V curves corresponding to different POA ambients are compared by the amount of the flat band voltage shift ($\Delta V_{fb}$), the relationship of:

$$H_2O\ \text{ambient} < N_2\ \text{ambient} < O_2\ \text{ambient}$$

holds. Therefore, the negative charge generation in the silicon oxide film or in the interface between the silicon oxide film and the SiC substrate for the POA with the $O_2$ ambient is larger than that with the $H_2O$ ambient. Conversely, in the case where the $H_2O$ ambient is employed as the POA ambient, it can be said that the negative charge generation in the silicon oxide film or in the interface between the silicon oxide film and the SiC substrate is minimized.

Moreover, if the interface state densities obtained from the C-V measurements by "the quasi-static method" are compared between the $H_2O$ and $O_2$ ambients, the density for the $H_2O$ ambient is smaller in about one figure than that for the $O_2$ ambient.

According to the third embodiment, the following effectiveness and technical advantages are obtained:

(1) During lowering the substrate temperature after the formation of the gate oxide film 5, the gate oxide film 5 receives the POA at substrate temperature of about 700° C.–1050° C., preferably of about 950° C. for about 60 minutes, while the supply of ultra-pure water is controlled to achieve the water rich ambient, maintaining the $H_2O$ partial pressure more than 0.95. Therefore, the increase of the interface state density between the silicon oxide film and the SiC can be effectively reduced without forming a new oxide film. If the interface state density is large, there is a problem that carrier mobility is lowered because the carriers moving in the channel region are trapped or scattered by Coulomb force ascribable to the interface state. Here, the carrier may be electrons or holes. However, such problem can be avoided by the POA in the water rich ambient, and a qualified SiC-MOS transistor can be obtained.

(2) Since the $H_2O$ direct oxidation furnace of the present invention is employed to execute the POA in the water rich ambient, the $H_2O$ partial pressure in the oxidizing ambient can be efficiently maintained more than 0.95, but other earlier thermal oxidation furnaces cannot achieve the condition easily.

In the third embodiment, the gate oxide film 5 is formed in the oxygen added ambient, or the mixture ambient in which $O_2$ gas is added sufficiently, and the POA is executed on the gate oxide film 5. However, it will be also possible that the silicon oxide film to receive the POA is formed in the water rich ambient, in which the $H_2O$ partial pressure is kept more than 0.95 as described in the first and second embodiment.

In the first, second and third embodiments, although it is described by the 4H—SiC substrate, a 6H—SiC substrate can be employed instead of the 4H—SiC substrate, and the effectiveness similar to those of the 4H—SiC substrate is also achieved for the 6H—SiC substrate.

Various modifications will become possible for those skilled in the art after receiving the teaching of the present disclosure without departing from the scope thereof.

This application claims benefit of priority under 35 USC 119 based on Japanese Patent Application No. P2000-231042 filed Aug. 31, 2000, the entire contents of which are incorporated by reference herein.

What is claimed is:

1. A method for manufacturing a SiC device, using selective oxidization of silicon, ascribable to the difference between an oxidation rate for SiC and the oxidation rate for silicon, without using a silicon nitride film as an oxidation protection mask, the method comprising:

depositing a silicon film above a SiC substrate;

delineating the silicon film into a required pattern so as to expose a part of a surface of the SiC substrate; and selectively oxidizing the delineated silicon film so as to grow a localized thermal oxide film in the required pattern above the SiC substrate by exposing simultaneously the part of the surface of the SiC substrate and all of the delineated silicon film to a water rich ambient.

2. The method of claim 1, wherein $H_2O$ partial pressure in the water rich ambient is selected such that oxidation rate for the silicon film is larger than that for the SiC substrate.

3. The method of claim 2, wherein the $H_2O$ partial pressure in the water rich ambient is kept more than 0.95.

4. The method of claim 1, wherein said silicon film is delineated into a pattern for an element isolation region.

5. A method for manufacturing a SiC device, comprising;

depositing a silicon film above a SiC substrate;

delineating the silicon film into required pattern;

annealing the SiC substrate in a water rich ambient to selectively grow a localized thermal oxide film above the SiC substrate;

forming a trench at the surface of the SiC substrate, before depositing said silicon film, wherein the silicon film is delineated such that the silicon film buries the trench, and the silicon film buried in the trench is selectively oxidized in the water rich ambient.

6. The method of claim 1, further comprising forming a blanket silicon oxide film at the surface of the SiC substrate in an oxygen added ambient, before depositing said silicon film so that said silicon film can deposit on the blanket silicon oxide film.

7. The method of claim 6, wherein the $H_2O$ partial pressure in the oxygen added ambient is kept less than 0.95.

8. The method of claim 6, further comprising selectively removing said blanket silicon oxide film using said silicon film as an etching mask so as to expose a part of the surface of the SiC substrate, before said silicon film is selectively oxidized in the water rich ambient.

9. A method for manufacturing a SiC device, comprising:

forming a blanket silicon oxide film at the surface of the SiC substrate in an oxygen added ambient;

depositing a silicon film on the blanket silicon oxide film;

delineating the silicon film into a required pattern;

selectively removing the blanket silicon oxide film using the silicon film as an etching mask so as to expose a part of the surface of the SiC substrate;

annealing the SiC substrate in a water rich ambient to selectively grow a localized thermal oxide film above the SiC substrate; and forming a thin silicon oxide film at the exposed part of the surface of the SiC substrate in the oxygen added ambient after selectively growing said localized thermal oxide film, wherein the oxygen added ambient and the water rich ambient are successively achieved in a same reaction tube so as not to expose the surface of the SiC substrate to an air outside of the reaction tube.

10. The method of claim 1, wherein said water rich ambient is achieved by directly introducing ultra pure water in a reaction tube for oxidation.

11. A method for manufacturing a SiC device, comprising:

forming a blanket silicon oxide film at the surface of the SiC substrate in an oxygen added ambient;

depositing a silicon film on the blanket silicon oxide film;

delineating the silicon film into a required pattern;

selectively removing the blanket silicon oxide film using the silicon film as an etching mask so as to expose a part of the surface of the SiC substrate;

annealing the SiC substrate in a water rich ambient to selectively grow a localized thermal oxide film above the SiC substrate;

forming a gate oxide film at the exposed part of the surface of the SiC substrate in the oxygen added ambient; and annealing said gate oxide film in the water rich ambient at substrate temperature lower than the substrate temperature at which the gate oxide film is formed.

12. The method of claim 8, further comprising:

depositing another silicon film at the exposed part of the surface of the SiC substrate;

annealing the SiC substrate in the water rich ambient to grow a gate oxide film at the exposed part of the surface of the SiC substrate; and annealing said gate oxide film in the water rich ambient at substrate temperature equal to or lower than the substrate temperature at which the gate oxide film is grown.

* * * * *